US012457837B2

(12) United States Patent
Kim et al.

(10) Patent No.: US 12,457,837 B2
(45) Date of Patent: Oct. 28, 2025

(54) DISPLAY DEVICE AND MANUFACTURING METHOD THEREOF

(71) Applicant: Samsung Display Co., LTD., Yongin-si (KR)

(72) Inventors: Su Jeong Kim, Yongin-si (KR); Young Jin Song, Yongin-si (KR); Jin Wan Kim, Yongin-si (KR); Dae Ho Song, Yongin-si (KR); Jin Woo Choi, Yongin-si (KR); Sang Jo Kim, Yongin-si (KR); Hoo Keun Park, Yongin-si (KR); Byung Ju Lee, Yongin-si (KR); Seung Geun Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 507 days.

(21) Appl. No.: 17/559,462

(22) Filed: Dec. 22, 2021

(65) Prior Publication Data

US 2022/0352238 A1 Nov. 3, 2022

(30) Foreign Application Priority Data

Apr. 30, 2021 (KR) .................. 10-2021-0056852

(51) Int. Cl.
*H10H 29/14* (2025.01)
*H10H 20/01* (2025.01)
*H10H 20/851* (2025.01)
*H10H 20/856* (2025.01)

(52) U.S. Cl.
CPC .......... *H10H 29/142* (2025.01); *H10H 20/01* (2025.01); *H10H 20/8514* (2025.01); *H10H 20/856* (2025.01); *H10H 20/0363* (2025.01)

(58) Field of Classification Search
None
See application file for complete search history.

(56) References Cited

U.S. PATENT DOCUMENTS

| 10,008,645 B2 | 6/2018 | Bonar et al. | |
|---|---|---|---|
| 10,636,349 B2 | 4/2020 | Shin et al. | |
| 2002/0084745 A1* | 7/2002 | Wang | H01L 33/504 313/498 |
| 2013/0168671 A1* | 7/2013 | Koike | H01L 29/45 257/43 |
| 2015/0311387 A1* | 10/2015 | Heikman | H01L 33/10 257/98 |
| 2016/0170129 A1* | 6/2016 | Xu | G02B 6/0055 349/67 |
| 2017/0237234 A1* | 8/2017 | Han | H01L 33/32 372/45.012 |

(Continued)

FOREIGN PATENT DOCUMENTS

| KR | 10-2018-0118488 | 10/2018 | |
|---|---|---|---|
| KR | 10-1968592 | 4/2019 | |
| WO | WO-2022104598 A1 * | 5/2022 | ......... H01L 33/0075 |

*Primary Examiner* — Jay C Chang
(74) *Attorney, Agent, or Firm* — CANTOR COLBURN LLP

(57) ABSTRACT

A display device includes light-emitting elements disposed on a substrate, wherein each of the light-emitting elements includes a first semiconductor layer, an active layer disposed on the first semiconductor layer, a second semiconductor layer disposed on the active layer, and a porous layer disposed on the second semiconductor layer.

12 Claims, 26 Drawing Sheets

(56) References Cited

U.S. PATENT DOCUMENTS

| | | | | |
|---|---|---|---|---|
| 2018/0006203 A1* | 1/2018 | Liu | ............... | H01L 25/0753 |
| 2020/0075813 A1* | 3/2020 | Joo | ............... | H10H 20/84 |
| 2020/0089054 A1* | 3/2020 | Lim | ............... | G02F 1/133605 |
| 2020/0295239 A1* | 9/2020 | Song | ............... | H01L 33/504 |
| 2023/0361252 A1* | 11/2023 | Zhu | ............... | H10H 20/851 |
| 2023/0387346 A1* | 11/2023 | Zhang | ............... | H01L 33/62 |

* cited by examiner

DISPLAY DEVICE AND MANUFACTURING METHOD THEREOF

CROSS-REFERENCE TO RELATED APPLICATION(S)

This application claims priority to and the benefit of Korean Patent Application No. 10-2021-0056852 under 35 U.S.C. 119, filed in the Korean Intellectual Property Office on Apr. 30, 2021, the entire contents of which are incorporated herein by reference.

BACKGROUND

1. Field

The disclosure relates to a light emitting display device and a manufacturing method thereof.

2. Description of the Related Art

Recently, as interest in information display increases, research and development of display devices continues.

SUMMARY

Aspects of the disclosure may provide a display device capable of improving light-output efficiency of a display panel and simplifying a manufacturing process, and a manufacturing method thereof.

Aspects of the disclosure are not limited to the aforesaid, but other aspects not described herein will be clearly understood by those skilled in the art from descriptions below.

A display device according to an embodiment may include a light-emitting element disposed on a substrate. Each of the light-emitting elements may include a first semiconductor layer, an active layer disposed on the first semiconductor layer, a second semiconductor layer disposed on the active layer, and a porous layer disposed on the second semiconductor layer.

The porous layer may include nanoscale pores.

The porous layer and the second semiconductor layer may include a same material.

The display device may further include bank patterns disposed on the substrate, wherein each of the light-emitting elements may be disposed between the bank patterns.

The bank patterns and the light-emitting elements may include a same material.

The display device may further include a color conversion layer disposed on the light-emitting elements.

The display device may further include a reflective layer disposed between the light-emitting elements.

The display device may further include an insulating layer disposed between the light-emitting elements and the reflective layer.

The light-emitting elements may include a first light-emitting element emitting a first color, a second light-emitting element emitting a second color, and a third light-emitting element emitting a third color.

A manufacturing method of a display device according to an embodiment may include forming a semiconductor layer, etching the semiconductor layer to form a porous layer, and providing a light-emitting stack on the porous layer to form light-emitting elements.

The forming of the porous layer may include forming nanoscale pores by the etching of the semiconductor layer.

The providing of the light-emitting stack may include etching the porous layer and the light-emitting stack.

The light-emitting stack may include a first semiconductor layer, a second semiconductor layer formed on the first semiconductor layer, and an active layer formed between the first semiconductor layer and the second semiconductor layer.

The second semiconductor layer and the porous layer may be formed of a same material.

The manufacturing method of the display device may further include etching the porous layer and the light-emitting stack to form bank patterns.

The bank patterns and the light-emitting elements may be simultaneously formed.

The forming of the semiconductor layer may include forming a second semiconductor layer between the porous layer and the light-emitting stack.

The providing of the light-emitting stack may include providing an active layer on the second semiconductor layer, and providing a first semiconductor layer on the active layer.

The manufacturing method may further include forming a planarization layer between the light-emitting elements.

The manufacturing method may further include forming a reflective layer between the light-emitting elements.

Specific details of other embodiments are included in specification and drawings.

According to an embodiment of the disclosure, a porous area included in the light-emitting elements may scatter light emitted from the light-emitting area, thereby improving light-output efficiency. Accordingly, since the scattering layer separately provided in the pixel may be omitted, the manufacturing process may be simplified and the manufacturing cost may be reduced.

Effects according to embodiments are not limited by the examples above, and more various effects are included in the specification.

DETAILED DESCRIPTION OF THE EMBODIMENTS

Figure 1:
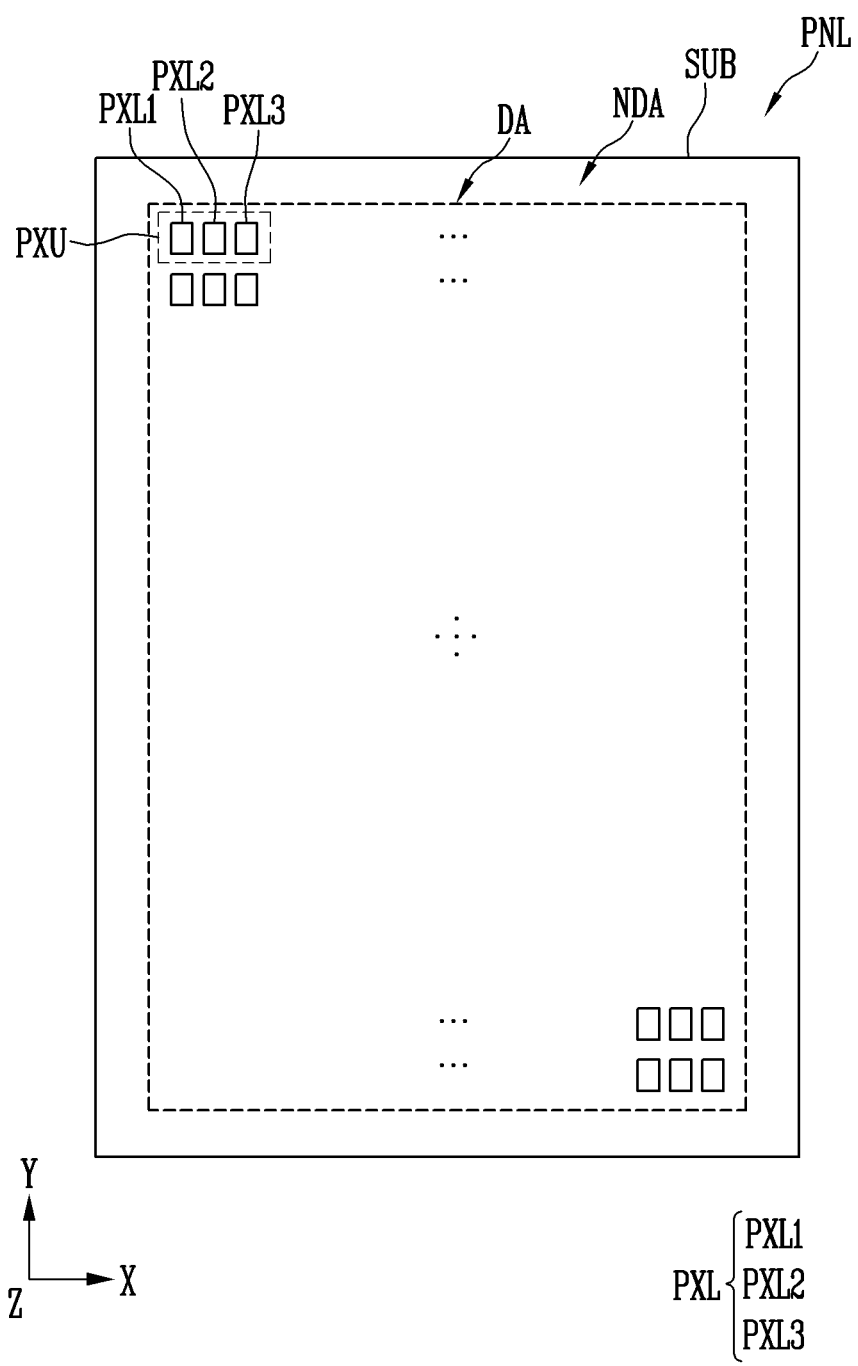
FIG. 1 is a schematic plan view illustrating a display device according to an embodiment.

Advantages and features of the disclosure, and implementation methods thereof will be clarified through the following embodiments described with reference to the accompanying drawings. However, the disclosure is not limited to the embodiments disclosed below, and may be implemented in various different forms. These embodiments are provided so that the disclosure is complete, and to completely inform the scope of the disclosure those of ordinary skill in the art, and the disclosure will be defined by a scope of the claims including equivalents thereof.

The terminology used in this specification is for the purpose of describing the embodiments and is not intended to limit the disclosure. In this specification, the singular also includes the plural (and vice versa) unless otherwise specified. The terms "comprises", "comprising", "has", "have", "having", "include", "including", and the like are used herein not to exclude the presence or addition of one or more other components, steps, operations and/or elements to the mentioned components, steps, operations and/or elements.

In addition, the term "connection" or "access" may refer to a physical and/or electrical connection or access collectively. In addition, it may refer to a direct or indirect connection or access and an integral or non-integral connection or access collectively.

It will be understood that when an element or a layer is referred to as being "on" another element or layer, it can be directly on another element or layer, or an intervening element or layer may also be present. The same reference numerals designate the same elements throughout the specification.

Although the terms "first", "second", and the like are used to describe various constituent elements, these constituent elements are not limited by these terms. These terms are used only to distinguish one constituent element from another constituent element. Therefore, the first constituent elements described below may be the second constituent elements within the technical spirit of the disclosure. In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the phrase "at least one of" is intended to include the meaning of "at least one selected from the group of" for the purpose of its meaning and interpretation. For example, "at least one of A and B" may be understood to mean "A, B, or A and B."

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

FIG. 1 illustrates a display device that can use a light-emitting element as a light source, particularly a display panel PNL provided in the display device.

For convenience of description, the structure of the display panel PNL will be briefly illustrated centering on the display area DA in FIG. 1. However, at least one driving circuit unit (e.g., at least one of a scan driver and a data driver), lines, and/or pads, which are not shown, may be further disposed on the display panel PNL according to the embodiment.

Referring to FIG. 1, the display panel PNL may include a substrate SUB and a pixel unit PXU disposed on the substrate SUB. Pixel units PXU may include first pixels PXL1, second pixels PXL2, and/or third pixels PXL3. Hereinafter, when at least one of the first pixels PXL1, the second pixels PXL2, and the third pixels PXL3 may be arbitrarily referred to, or when two or more types of pixels may be collectively referred to, the same may be referred to as "pixel PXL" or "pixels PXL".

The substrate SUB may constitute a base member of the display panel PNL, and may be a rigid or flexible substrate or film. For example, the substrate SUB may be made of a rigid substrate made of glass or tempered glass, or a flexible substrate (or thin film) made of plastic or metal, and the material and/or physical properties of the substrate SUB are not particularly limited.

The display panel PNL and the substrate SUB for forming the same may include a display area DA for displaying an image and a non-display area NDA excluding the display area DA. The pixels PXL may be disposed in the display area DA. Various lines, pads, and/or built-in circuit units connected to the pixels PXL of the display area DA may be disposed in the non-display area NDA. The pixels PXL may be regularly arranged according to a stripe or PENTILE™ arrangement structure. However, the arrangement structure of the pixels PXL is not necessarily limited thereto, and the pixels PXL may be arranged in the display area DA in various structures and/or methods.

According to an embodiment, two or more types of pixels PXL emitting light of different colors may be disposed in the display area DA. For example, in the display area DA, first pixels PXL1 emitting light of a first color, second pixels PXL2 emitting light of a second color, and third pixels PXL3 emitting light of a third color may be arranged in the display area DA. At least one of the first to third pixels PXL1, PXL2, and PXL3 adjacent to each other may constitute a pixel unit PXU capable of emitting light of various colors. For example, each of the first to third pixels PXL1, PXL2, and PXL3 may be a sub-pixel emitting light of a color. According to an embodiment, the first pixel PXL1 may be a red pixel emitting red light, the second pixel PXL2 may be a green pixel emitting green light, and the third pixel PXL3 may be a blue pixel emitting blue light, but embodiments are not limited thereto.

In an embodiment, each of the first pixel PXL1, the second pixel PXL2, and the third pixel PXL3 may include light-emitting elements emitting light of the same color as each other, and may include the color conversion layer and/or the color filter of different colors, disposed on each of the light-emitting elements, thereby emitting light of the first color, the second color, and the third color, respectively. In another embodiment, each of the first pixel PXL1, the second pixel PXL2, and the third pixel PXL3 may use the light-emitting element of the first color, the light-emitting element of the second color, and the light-emitting element of the third color as light sources, respectively, thereby light of the first color, the second color and the third color, respectively. However, the color, type, and/or number of the pixels PXL constituting the pixel unit PXU are not particularly limited. For example, the color of light emitted from each pixel PXL may be variously changed.

The pixel PXL may include at least one light source driven by a control signal (e.g., a scan signal and a data signal) and/or a power supply (e.g., a first power supply and a second power supply). In an embodiment, the light source may include ultra-small pillar light-emitting elements having a size as small as a nanometer scale to a micrometer scale. However, the disclosure is not necessarily limited thereto, and various types of light-emitting elements may be used as the light source of the pixel PXL.

In an embodiment, each pixel PXL may be formed of active pixels. However, the type, structure, and/or driving method of the pixels PXL applicable to the display device are not particularly limited. For example, each pixel PXL may be made of a pixel of a passive or active light-emitting display device having various structures and/or driving methods.

Figure 2:
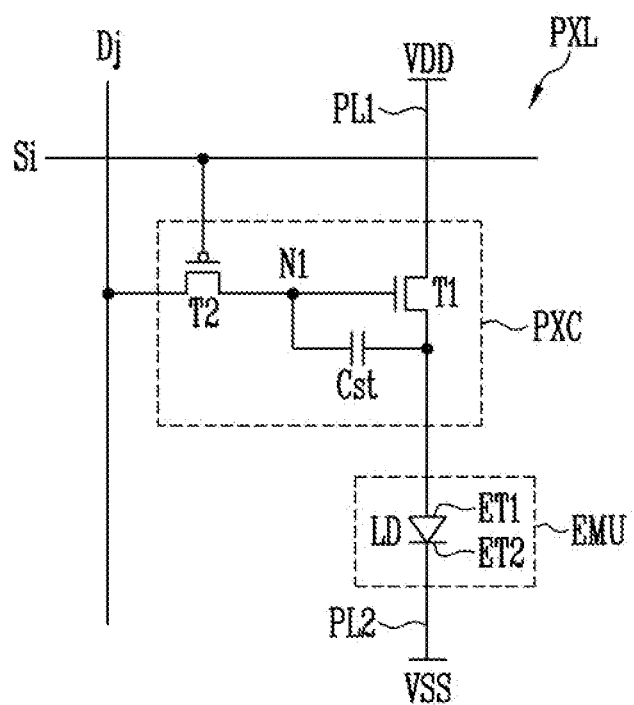
FIG. 2 is a schematic circuit diagram of a pixel according to an embodiment.

FIG. 2 is a schematic circuit diagram of a pixel according to an embodiment.

FIG. 2 illustrates an electrical connection relationship between constituent elements included in a pixel PXL that can be applied to an active display device. However, the types of constituent elements included in the pixel PXL are not necessarily limited thereto.

According to an embodiment, the pixel PXL illustrated in FIG. 2 may be any of the first pixel PXL1, the second pixel PXL2, and the third pixel PXL3 provided in the display panel PNL of FIG. 1. The first pixel PXL1, the second pixel PXL2, and the third pixel PXL3 may have substantially the same or similar structure to each other.

Referring to FIG. 2, each pixel PXL may include a light-emitting unit EMU that generates light having luminance corresponding to a data signal. Also, the pixel PXL may further include a pixel circuit PXC for driving the light-emitting unit EMU.

According to an embodiment, the light-emitting unit EMU may include at least one light-emitting element LD electrically connected between a first power line PL1 to which a voltage of first power supply VDD may be applied and a second power line PL2 to which a voltage of second power supply VSS may be applied. For example, the light-emitting unit EMU may include the first electrode ET1 connected to the first power supply VDD via the pixel circuit PXC and the first power line PL1, a second electrode ET2 connected to the second power supply VSS through the second power line PL2, and the light-emitting element LD connected between the first electrode ET1 and the second electrode ET2. In an embodiment, the first electrode ET1 may be an anode electrode, and the second electrode ET2 may be a cathode electrode.

The light-emitting element LD may include an end connected to the first power supply VDD and another end connected to the second power supply VSS. In embodiments, an end of the light-emitting element LD may be provided integrally with the first electrode ET1 to be connected to the first electrode ET1, and another end of the light-emitting element LD may be provided integrally with the second electrode ET2 to be connected to the second electrode ET2. The first power supply VDD and the second power supply VSS may have different potentials. In this case, the potential difference between the first and second power supplies VDD and VSS may be set to be equal to or greater than the threshold voltage of the light-emitting element LD during the light-emitting period of the pixel PXL.

The light-emitting element LD may constitute an effective light source of the light-emitting unit EMU. The light-emitting element LD may emit light with a luminance corresponding to a driving current supplied through the pixel circuit PXC. For example, during each frame period, the pixel circuit PXC may supply a driving current corresponding to a grayscale value of corresponding frame data to the light-emitting unit EMU. The driving current supplied to the light-emitting unit EMU may flow through the light-emitting element LD. Accordingly, the light-emitting element LD may emit light with a luminance corresponding to the driving current, and the light-emitting unit EMU may emit light.

The pixel circuit PXC may be connected to the scan line Si and the data line Dj of the pixel PXL. For example, in case that the pixel PXL is disposed in the i-th row (i may be a natural number) and j-th column (j may be a natural number) of the display area DA, the pixel circuit PXC of the pixel PXL may be connected to the i-th scan line Si and the j-th data line Dj of the display area DA. According to an embodiment, the pixel circuit PXC may include first and second transistors T1 and T2 and a storage capacitor Cst. However, the structure of the pixel circuit PXC is not limited to the embodiment shown in FIG. 2.

The pixel circuit PXC may include first and second transistors T1 and T2 and a storage capacitor Cst.

A first terminal of a first transistor T1 (i.e., driving transistor) may be connected to the first power supply VDD, and a second terminal thereof may be electrically connected to the light-emitting element LD. A gate electrode of the first transistor T1 may be connected to the first node N1. The first transistor T1 may control an amount of the driving current supplied to the light-emitting element LD in response to a voltage of the first node N1.

A first terminal of the second transistor T2 (i.e., switching transistor) may be connected to the j-th data line Dj, and the second terminal thereof may be connected to the first node N1. Here, the first terminal and the second terminal of the second transistor T2 may be different terminals. For example, in case that the first terminal is a source electrode, the second terminal may be a drain electrode. A gate electrode of the second transistor T2 may be connected to the i-th scan line Si.

The second transistor T2 may be turned on in case that a scan signal of a voltage at which the second transistor T2 can be turned on is supplied from the i-th scan line Si, and may electrically connect the j-th data line Dj and the first node N1. In this case, the data signal of the corresponding frame may be supplied to the j-th data line Dj, and accordingly, the data signal may be transferred to the first node N1. The data signal transferred to the first node N1 may be charged in the storage capacitor Cst.

The storage capacitor Cst may charge a voltage corresponding to the data signal supplied to the first node N1, and may maintain the charged voltage until the data signal of the next frame may be supplied.

In FIG. 2, the pixel circuit PXC is shown including the second transistor T2 for transferring the data signal into the pixel PXL, a storage capacitor Cst for storing the data signal, and the first transistor T1 for supplying a driving current corresponding to the data signal to the light-emitting element LD, but the disclosure is not limited thereto, and the structure of the pixel circuit PXC may be variously changed. For example, the pixel circuit PXC may further include at least one transistor element such as a transistor element for compensating for the threshold voltage of the first transistor T1, a transistor element for initializing the first node N1, and/or a transistor element for controlling the light emitting time of the light-emitting element LD, and the like, or other circuit elements such as a boosting capacitor for boosting a voltage of the first node N1, and the like. Also, the first and second transistors T1 and T2 of the pixel circuit PXC are not limited to FIG. 2, and may be variously changed to NMOS or PMOS.

Figure 3:
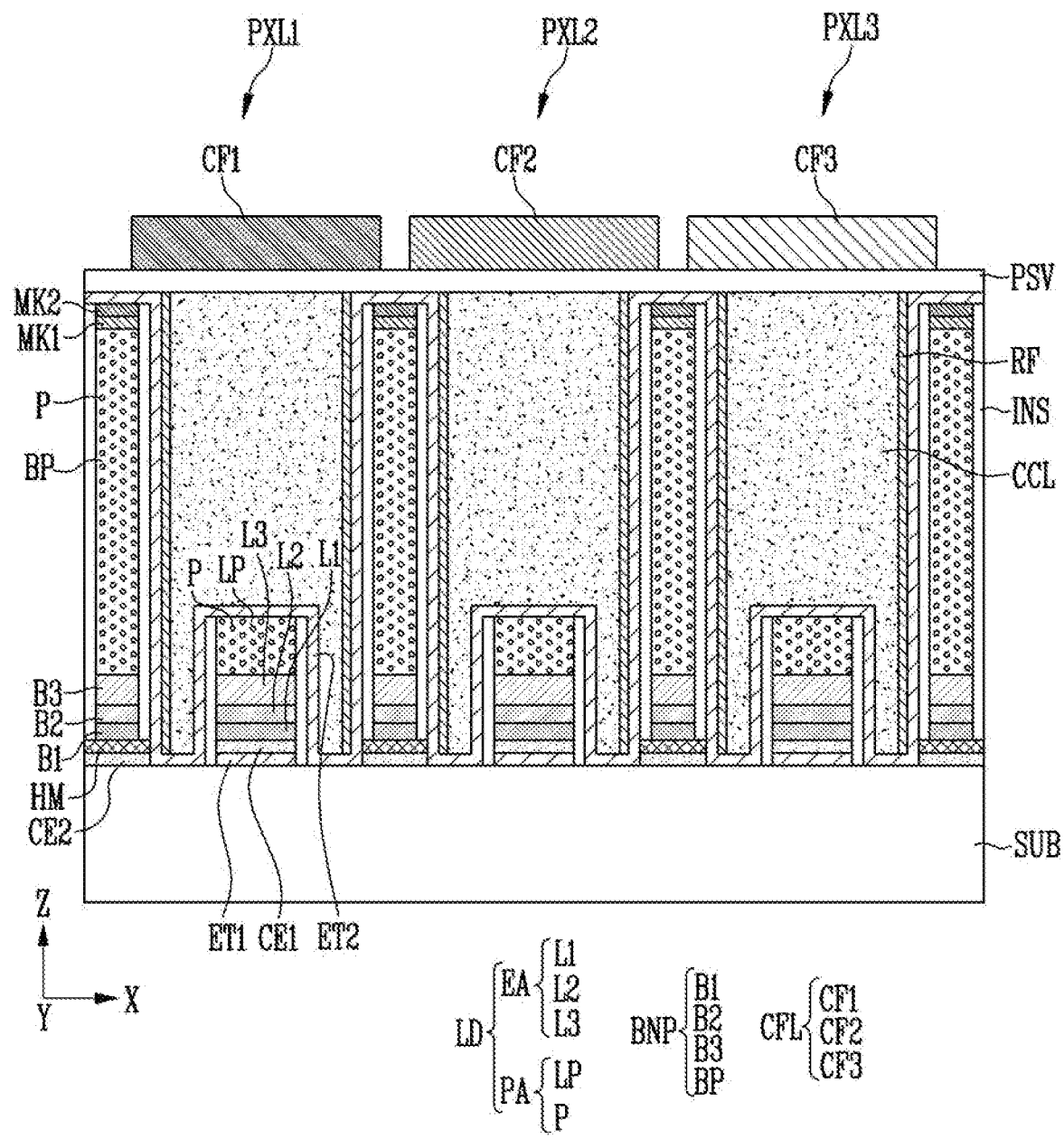
FIGS. 3 and 4 are schematic cross-sectional views illustrating a pixel according to an embodiment.
Figure 4:
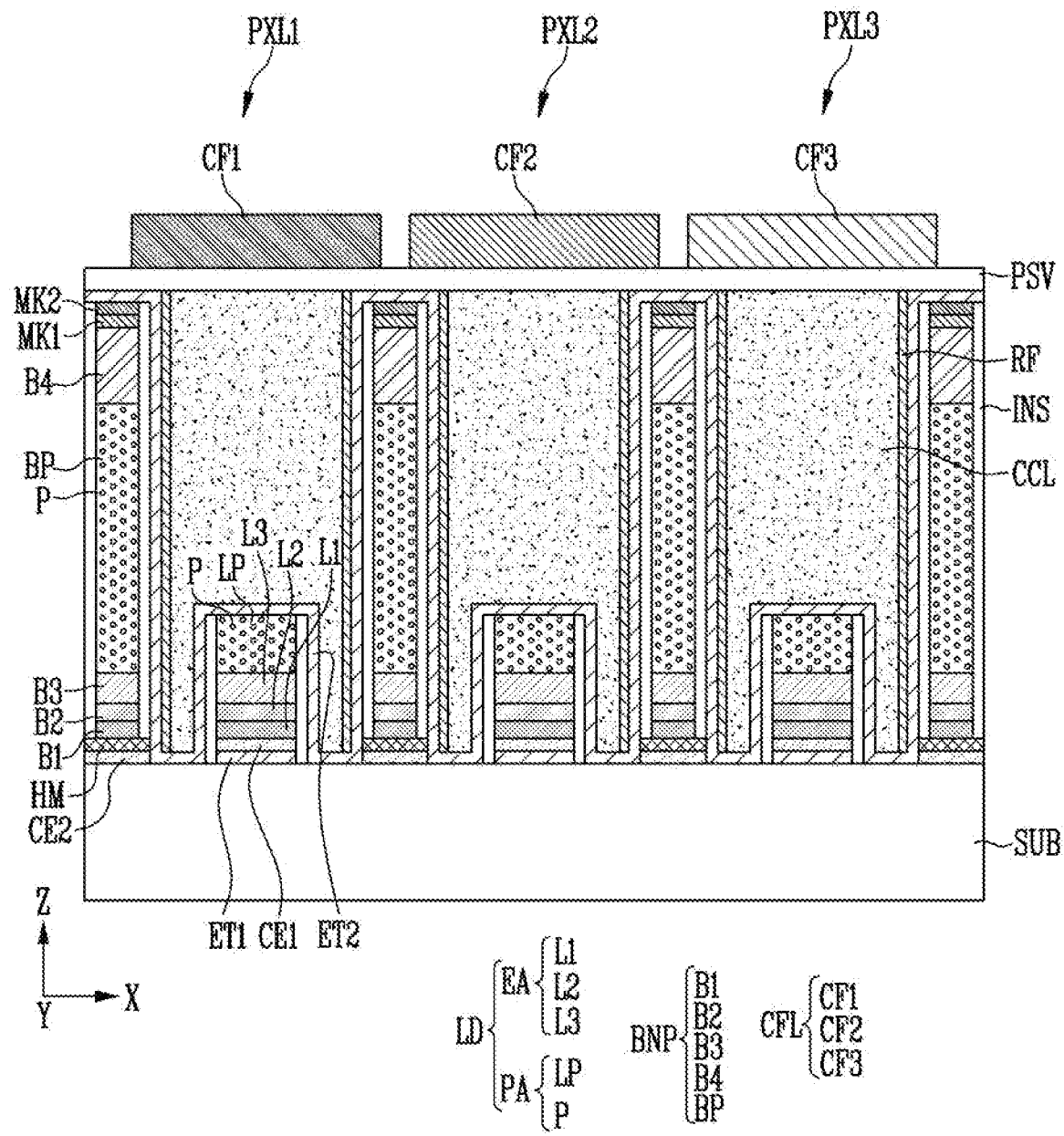

FIGS. 3 and 4 are schematic cross-sectional views illustrating a pixel according to an embodiment.

FIGS. 3 and 4 schematically illustrate cross-sectional structures of a first pixel PXL1, a second pixel PXL2, and a third pixel PXL3 adjacent to each other.

Referring to FIGS. 3 and 4, a pixel PXL and a display device including the same may include a substrate SUB, bank patterns BNP disposed on the substrate SUB, light-emitting elements LD, a color conversion layer CCL, and a color filter layer CFL.

The substrate SUB may be a driving substrate including circuit elements including transistors constituting the pixel circuit PXC (see FIG. 2) of each pixel PXL. For example, the substrate SUB may be a driving substrate manufactured in a wafer state. The substrate SUB may use a CMOS substrate including a combination of NMOS and PMOS, but is not limited thereto.

The bank patterns BNP may be disposed on a boundary between the first to third pixels PXL1, PXL2, and PXL3 on the substrate SUB. Each of the bank patterns BNP may be provided in a shape extending in a direction. For example, each of the bank patterns BNP may be provided on the substrate SUB in a shape extending in the third direction (i.e., Z-axis direction) from the substrate SUB.

The bank patterns BNP may include a first semiconductor layer B1, an active layer B2, a second semiconductor layer B3, and a porous layer BP. For example, the first semiconductor layer B1, the active layer B2, the second semiconductor layer B3, and the porous layer BP of the bank patterns BNP may be sequentially stacked on the substrate SUB in the third direction (i.e., Z-axis direction).

The first semiconductor layer B1 of the bank patterns BNP may include, for example, at least one p-type semiconductor layer. For example, the first semiconductor layer B1 of the bank patterns BNP may include at least one semiconductor material of GaN, InGaN, InAlGaN, AlGaN, and AlN, and may include p-type semiconductor layer doped with a first conductive dopant (or a p-type dopant) such as Mg, Zn, Ca, Sr, Ba, and the like, or a combination thereof. For example, the first semiconductor layer B1 of the bank patterns BNP may include a GaN semiconductor material doped with the first conductive dopant (or the p-type dopant), but is not necessarily limited thereto. The first semiconductor layer B1 of the bank patterns BNP may be formed of various other materials.

The active layer B2 of the bank patterns BNP may be disposed between the first semiconductor layer B1 and the second semiconductor layer B3. The active layer B2 of the bank patterns BNP may include at least one of a single well structure, a multiple well structure, a single quantum well structure, a multi quantum well (MQW) structure, a quantum dot structure, and a quantum line structure, but is not necessarily limited thereto. The active layer B2 of the bank patterns BNP may include GaN, InGaN, InAlGaN, AlGaN, AlN, or a combination thereof, and various other materials may constitute the active layer B2 of the bank patterns BNP.

The second semiconductor layer B3 of the bank patterns BNP may be disposed on the active layer B2, and may include a semiconductor layer of a different type from the first semiconductor layer 131. In an embodiment, the second semiconductor layer B3 of the bank patterns BNP may include at least one n-type semiconductor layer. For example, the second semiconductor layer B3 of the bank patterns BNP may include at least one semiconductor material of GaN, InGaN, InAlGaN, AlGaN, and AlN, and may be an n-type semiconductor layer doped with a second conductive dopant (or an n-type dopant) such as Si, Ge, Sn, and the like, or a combination thereof. For example, the second semiconductor layer B3 of the bank patterns BNP may include a GaN semiconductor material doped with the second conductive dopant (or the n-type dopant). However, the material constituting the second semiconductor layer B3 of the bank patterns BNP is not limited thereto, and the second semiconductor layer B3 of the bank patterns BNP may be formed of various other materials.

The porous layer BP of the bank patterns BNP may be disposed on the second semiconductor layer B3. The porous layer BP of the bank patterns BNP may include the same material as the second semiconductor layer B3, but is not limited thereto. For example, the porous layer BP of the bank patterns BNP may include at least one n-type semiconductor layer. For example, the porous layer BP of the bank patterns BNP may include at least one semiconductor material of GaN, InGaN, InAlGaN, AlGaN, and AlN, and may be an n-type semiconductor layer doped with a second conductive dopant (or an n-type dopant) such as Si, Ge, Sn, and the like, or a combination thereof. For example, the porous layer BP of the bank patterns BNP may include a GaN semiconductor material doped with the second conductive dopant (or the n-type dopant). However, the material constituting the porous layer BP of the bank patterns BNP is not limited thereto, and the porous layer BP of the bank patterns BNP may be formed of various other materials.

The porous layer BP of the bank patterns BNP may include a plurality of pores P. The pores P may be nanoscale pores P formed by electrochemical etching, but are not limited thereto. A detailed description thereof will be described later with reference to FIG. 8.

The bank patterns BNP may further include mask layers MK1 and MK2 disposed on the porous layer BP. The mask layers MK1 and MK2 may include a first mask layer MK1 disposed on the porous layer BP and a second mask layer MK2 disposed on the first mask layer MK1. The first mask layer MK1 and the second mask layer MK2 may be formed of different materials. For example, the first mask layer MK1 may include silicon oxide (SiOx), and the second mask layer MK2 may include nickel (Ni), but are not limited thereto.

According to embodiments, as shown in FIG. 4, the bank patterns BNP may further include a semiconductor layer B4 disposed between the porous layer BP and the mask layers MK1 and MK2. The semiconductor layer B4 may include a semiconductor material such as undoped GaN, InGaN, InAlGaN, AlGaN, AlN, or a combination thereof, but is not limited thereto. The thickness of the semiconductor layer B4 in the third direction (i.e., Z-axis direction) may be smaller than the thickness in the third direction (i.e., Z-axis direction) of the porous layer BP, but is not limited thereto.

The light-emitting elements LD may be disposed in each of the first to third pixels PXL1, PXL2, and PXL3. The light-emitting elements LD may be disposed between the bank patterns BNP on the substrate SUB.

Each of the light-emitting elements LD may be provided in various shapes. For example, the light-emitting elements LD may have a rod-like shape or a bar-like shape that may be long in the third direction (i.e., Z-axis direction) (i.e., with an aspect ratio greater than 1), but are not necessarily limited thereto. For example, each of the light-emitting elements LD may have a pillar shape in which a diameter of an end and a diameter of another end may be different from each other. The light-emitting elements LD may be light-emitting diodes (LED) manufactured with ultra-small size so as to have a diameter and/or length of a nanometer scale to a micrometer scale. However, the disclosure is not necessarily limited thereto, and the size of the light-emitting element LD may be variously changed to meet requirements (or design conditions) of a lighting device or a display device to which the light-emitting element LD may be applied.

Each of the light-emitting elements LD may include a light-emitting area EA and a porous area PA. The light-emitting area EA may be provided between the substrate SUB and the porous area PA.

The light-emitting area EA may include a first semiconductor layer L1, a second semiconductor layer L3, and an active layer L2 interposed between the first and second semiconductor layers L1 and L3. For example, the first semiconductor layer L1, the active layer L2, and the second semiconductor layer L3 of the light-emitting elements LD may be sequentially stacked in the third direction (i.e., Z-axis direction) on the substrate SUB.

The first semiconductor layer L1 of the light-emitting elements LD may include, for example, at least one p-type semiconductor layer. For example, the first semiconductor layer L1 of the light-emitting elements LD may include at least one semiconductor material of GaN, InGaN, InAlGaN, AlGaN, and AlN, and may include the p-type semiconductor layer doped with the first conductive dopant (or the p-type dopant) such as Mg, Zn, Ca, Sr, Ba, and the like, or a combination thereof. For example, the first semiconductor layer L1 of the light-emitting elements LD may include a GaN semiconductor material doped with a first conductive dopant (or a p-type dopant), but is not necessarily limited thereto. The first semiconductor layer L1 of the light-emitting elements LD may be formed of various other material.

The active layer L2 of the light-emitting elements LD may be disposed between the first semiconductor layer L1 and the second semiconductor layer L3. The active layer L2 of the light-emitting elements LD may include at least one of a single well structure, a multi well structure, a single quantum well structure, a multi quantum well (MQW) structure, a quantum dot structure, and a quantum line structure, but is not necessarily limited thereto. The active layer L2 of the light-emitting elements LD may include GaN, InGaN, InAlGaN, AlGaN, AlN, or a combination thereof, and various other materials may constitute the active layer L2 of the light-emitting elements LD.

In case that a signal (or voltage) is applied to each end of the light-emitting elements LD, each light-emitting element LD emits light while electron-hole pairs are combined in the active layer L2 of the light-emitting elements LD. By controlling the light-emitting of each light-emitting element LD using this principle, the light-emitting element LD can be used as a light source of various light-emitting elements including the pixel PXL of a display device.

According to embodiments, an electron blocking layer (EBL) may be further disposed between the active layer L2 and the first semiconductor layer L1 of the light-emitting elements LD. The electron blocking layer may block the flow of electrons supplied from the second semiconductor layer L3 from escaping to the first semiconductor layer L1, thereby increasing the electron-hole recombination probability in the active layer L2. The energy bandgap of the electron blocking layer may be greater than that of the active layer L2 and/or the first semiconductor layer L1, but is not limited thereto.

According to embodiments, a super lattice layer (SLs) may be further disposed between the active layer L2 and the second semiconductor layer L3 of the light-emitting elements LD. The super lattice layer may relieve the stress of the active layer L2 and the second semiconductor layer L3 to improve the quality of the light-emitting elements LD. For example, the super lattice layer may be formed in a structure in which InGaN and GaN are alternately stacked, but is not limited thereto.

The second semiconductor layer L3 of the light-emitting elements LD may be disposed on the active layer L2, and may include a semiconductor layer of a different type from the first semiconductor layer L1. In an embodiment, the second semiconductor layer L3 of the light-emitting elements LD may include at least one n-type semiconductor layer. For example, the second semiconductor layer L3 of the light-emitting elements LD may include a semiconductor material such as GaN, InGaN, InAlGaN, AlGaN, AlN, or a combination thereof, and may be an n-type semiconductor layer doped with a second conductive dopant (or an n-type dopant) such as Si, Ge, Sn, and the like, or a combination thereof. For example, the second semiconductor layer L3 of the light-emitting elements LD may include a GaN semiconductor material doped with the second conductive dopant (or the n-type dopant). However, the material constituting the second semiconductor layer L3 of the light-emitting elements LD is not limited thereto, and various materials may be used to form the second semiconductor layer L3 of the light-emitting elements LD.

The porous area PA may be provided on the second semiconductor layer L3 of the light-emitting area EA. For example, the porous area PA may be directly formed on the second semiconductor layer L3 of the light-emitting area EA. The porous area PA may include the same material as the second semiconductor layer L3, but is not limited thereto.

The porous area PA may include a porous layer LP. The porous layer LP of the light-emitting elements LD may include the same material as the second semiconductor layer L3, but is not limited thereto. For example, the porous layer LP of the light-emitting elements LD may include at least one n-type semiconductor layer. For example, the porous layer LP of the light-emitting elements LD may include a semiconductor material such as GaN, InGaN, InAlGaN, AlGaN, AlN, or a combination thereof, and may be an n-type semiconductor layer doped with a second conductive dopant (or an n-type dopant) such as Si, Ge, Sn, and the like, or a combination thereof. For example, the porous layer LP of the light-emitting elements LD may include a GaN semiconductor material doped with the second conductive dopant (or the n-type dopant). However, the material constituting the porous layer LP of the light-emitting elements LD is not limited thereto, and various other materials may be used to form the porous layer LP of the light-emitting elements LD.

The porous area PA may include a plurality of pores P present in the porous layer LP. The pores P may be nanoscale pores P formed by electrochemical etching, but are not necessarily limited thereto. A detailed description thereof will be described later with reference to FIG. 8.

The porous area PA may be provided on the light-emitting area EA to scatter light emitted from the light-emitting area EA, thereby improving light-output efficiency. For example, the refractive index of the porous area PA may be reduced due to the plurality of pores P, thereby increasing light extraction efficiency. For example, the porous area PA may function as a scattering layer. As such, in case that the porous area PA is included in the light-emitting elements LD, a scattering layer separately provided in the pixel PXL may be omitted, thereby simplifying the manufacturing process and reducing costs. The porous area PA may be provided between the light-emitting area EA and the color conversion layer CCL to be described later to effectively prevent the color conversion layer CCL from being damaged due to heat generation of the light-emitting area EA.

In an embodiment, the light-emitting elements LD and the bank patterns BNP may include the same material. For example, the first semiconductor layer L1, the active layer L2, the second semiconductor layer L3, and/or the porous layer LP of the light-emitting elements LD may include the same material as the first semiconductor layer B1, the active layer B2, the second semiconductor layer B3, and/or the porous layer BP of the above-described bank patterns BNP, respectively. In this case, the first semiconductor layer L1, the active layer L2, the second semiconductor layer L3, and/or the porous layer LP of the light-emitting elements LD may be simultaneously formed in the same process as the first semiconductor layer B1, the active layer B2, the second semiconductor layer B3, and/or the porous layer BP of the bank patterns BNP. Accordingly, the manufacturing process of the display device may be simplified to secure process economics. A detailed description thereof will be described later with reference to FIG. 12.

The light-emitting elements LD may be disposed on the first electrode ET1 provided on the substrate SUB. For example, the first semiconductor layer L1 of the light-emitting elements LD may be disposed on the first electrode ET1 to be electrically connected to the first electrode ET1. The first electrode ET1 may include a metal or a metal oxide. For example, the first electrode ET1 may include copper (Cu), gold (Au), chromium (Cr), titanium (Ti), aluminum (Al), nickel (Ni), indium tin oxide (ITO), oxides, or alloys thereof, and the like, and may include an oxide or an alloy, but is not necessarily limited thereto.

According to embodiments, connection electrodes CE1 and CE2 may be further disposed between the substrate SUB, the light-emitting elements LD and/or the bank patterns BNP. The connection electrodes CE1 and CE2 may include a first connection electrode CE1 provided between the light-emitting elements LD and the substrate SUB and a second connection electrode CE2 provided between the bank patterns BNP and the substrate SUB.

The first connection electrode CE1 may be disposed between the first semiconductor layer L1 of the light-emitting elements LD and the first electrode ET1 provided on the substrate SUB. The light-emitting elements LD may be electrically connected to the first electrode ET1 provided on the substrate SUB through the first connection electrode CE1.

The second connection electrode CE2 may include the same material as the first connection electrode CE1. For example, each of the first and second connection electrodes CE1 and CE2 may include a metal or a metal oxide. For example, each of the first and second connection electrodes CE1 and CE2 may include copper (Cu), gold (Au), chromium (Cr), titanium (Ti), aluminum (Al), nickel (Ni), indium tin oxide (ITO), oxides or alloys thereof, and the like, but are not necessarily limited thereto. The second connection electrode CE2 may be simultaneously formed in the same process as the first connection electrode CE1, but is not necessarily limited thereto.

A hard mask layer HM may be further disposed between the bank patterns BNP and the second connection electrode CE2. The hard mask layer HM may be disposed between the first semiconductor layer B1 and the second connection electrode CE2 of the bank patterns BNP. The hard mask layer HM may be omitted according to embodiments.

An insulating layer INS may be provided on surfaces of the light-emitting elements LD and/or the bank patterns BNP. The insulating layer INS may be provided on side surfaces of the light-emitting elements LD and/or the bank patterns BNP. The insulating layer INS may prevent an electrical short that may occur in case that the active layer L2 of the light-emitting elements LD contacts conductive materials other than the first and second semiconductor layers L1 and L3. The insulating layer INS may minimize surface defects of the light-emitting elements LD, thereby improving lifespan and luminous efficiency of the light-emitting elements LD.

The insulating layer INS may cover the side surfaces of the light-emitting elements LD and/or the bank patterns BNP, but may be partially removed to expose upper surfaces of the light-emitting elements LD and/or the bank patterns BNP. For example, the insulating layer INS may cover the side surfaces of the light-emitting elements LD, but may be partially removed to expose the porous area PA of the light-emitting elements LD, that is, the porous layer LP.

The insulating film INS may include silicon oxide (SiOx), silicon nitride (SiNx), silicon oxynitride (SiOxNy), silicon oxycarbide (SiOxCy), aluminum oxide (AlOx), aluminum nitride (AlNx), zirconium oxide (ZrOx), hafnium oxide (HfOx), titanium oxide (TiOx), or a combination thereof, but is not necessarily limited thereto.

A second electrode ET2 may be disposed on the light-emitting elements LD. The second electrode ET2 may be directly disposed on upper surfaces of the light-emitting elements LD exposed by the insulating layer INS. For example, the second electrode ET2 may be directly disposed on the porous area PA of the light-emitting elements LD, that is, the porous layer LP. The second electrode ET2 may be disposed over the first to third pixels PXL1, PXL2, and PXL3.

The second electrode ET2 may be formed of various transparent conductive materials. For example, the second electrode ET2 may include at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), and gallium tin oxide (GTO), and may be implemented to be substantially transparent or translucent to satisfy a light transmittance. Accordingly, the light emitted from the light-emitting elements LD may pass through the second electrode ET2 and be emitted to the outside of the display panel PNL.

A color conversion layer CCL may be disposed on the light-emitting elements LD. The color conversion layer CCL may be disposed between the bank patterns BNP. For example, the color conversion layer CCL may be provided in a space or an opening defined by the bank patterns BNP.

The color conversion layer CCL may include quantum dots as a color conversion material that converts light emitted from the light-emitting elements LD of each pixel PXL into light of a specific color. For example, the color conversion layer CCL may include a plurality of quantum dots dispersed in a matrix material such as a base resin.

In an embodiment, the first to third pixels PXL1, PXL2, and PXL3 may include light-emitting elements LD that emit light of the same color. For example, the first to third pixels PXL1, PXL2, and PXL3 may include light-emitting elements LD emitting a third color (or blue). The color conversion layer CCL may include quantum dots that convert blue light emitted from the light-emitting element LD into white light. For example, the color conversion layer CCL may include a first quantum dot that converts blue light emitted from the blue light-emitting element into red light and a second quantum dot that converts blue light into green light, but is not necessarily limited thereto. In case that a quantum dot is used the a color conversion material, the absorption coefficient of the quantum dot may be increased by injecting blue light having a relatively short wavelength among the visible light range into the quantum dot. Accordingly, the light efficiency emitted from the pixels PXL can be improved and excellent color reproducibility can be secured. The light-emitting unit EMU of the first to third pixels PXL1, PXL2, and PXL3 may be composed of the light-emitting elements LD (e.g., blue light-emitting elements) of the same color, thereby manufacturing efficiency of the display device can be increased. However, the disclosure is not limited thereto, and the first to third pixels PXL1, PXL2, and PXL3 may include light-emitting elements LD that emit light of different colors. For example, the first pixel PXL1 may include a first color (or red) light-emitting element LD, the second pixel PXL2 may include a second color (or green) light-emitting element LD, and the third pixel PXL3 may include a third color (or blue) light-emitting element LD.

According to embodiments, a reflective layer RF may be disposed between the bank patterns BNP and the color conversion layer CCL. The reflective layer RF may reflect light emitted from the light-emitting elements LD to improve light-output efficiency of the display panel PNL. The reflective layer RF may be disposed on side surfaces of the bank patterns BNP to prevent color mixing between adjacent pixels PXL. The material of the reflective layer RF is not particularly limited, and may include various reflective materials.

A passivation layer PSV may be disposed on the color conversion layer CCL. The passivation layer PSV may directly cover the color conversion layer CCL. The passivation layer PSV may be disposed over the first to third pixels PXL1, PXL2, and PXL3. The passivation layer PSV may prevent impurities such as moisture or air from penetrating from the outside and damaging or contaminating the color conversion layer CCL. A surface of the passivation layer PSV may be in contact with the color conversion layer CCL, and another surface of the passivation layer PSV may be in contact with a color filter layer CFL, which will be described later.

The passivation layer PSV may include an organic material such as acrylates resin, epoxy resin, phenolic resin, polyamides resin, polyimides resin, polyesters resin, polyphenylenesulfides resin, benzocyclobutene (BCB), or a combination thereof, but is not necessarily limited thereto.

According to embodiments, the passivation layer PSV may include an inorganic material such as silicon oxide (SiOx), silicon nitride (SiNx), silicon oxynitride (SiOxNy), silicon oxycarbide (SiOxCy), aluminum oxide (AlOx), aluminum nitride (AlNx), zirconium oxide (ZrOx), hafnium oxide (HfOx), titanium oxide (TiOx), or a combination thereof.

A color filter layer CFL may be disposed on the passivation layer PSV. The color filter layer CFL may be disposed between the bank patterns BNP. The color filter layer CFL may include color filters CF1, CF2, and CF3 corresponding to the color of each pixel PXL. A full-color image may be displayed by disposing color filters CF1, CF2, and CF3 corresponding to colors of the first to third pixels PXL1, PXL2, and PXL3 respectively.

The color filter layer CFL may include a first color filter CF1 that may be disposed in the first pixel PXL1 and selectively transmit light emitted from the first pixel PXL1, a second color filter CF2 that may be disposed in the second pixel PXL2 and selectively transmit light emitted from the second pixel PXL2, and a third color filter CF3 that may be disposed in the third pixel PXL3 and selectively transmit light emitted from the third pixel PXL3.

In an embodiment, the first color filter CF1, the second color filter CF2, and the third color filter CF3 may be a red color filter, a green color filter, and a blue color filter, respectively, but are not necessarily limited thereto. Hereinafter, the term "color filter CF" or "color filters CF" may refer to any color filter of the first color filter CF1, the second color filter CF2, and the third color filter CF3, or may refer to two or more types of color filters collectively.

The first color filter CF1 may overlap the light-emitting element LD and the color conversion layer CCL of the first pixel PXL1 in the third direction (i.e., Z-axis direction). The first color filter CF1 may include a color filter material that selectively transmits light of a first color (or red). For example, in case that the first pixel PXL1 is the red pixel, the first color filter CF1 may include a red color filter material.

The second color filter CF2 may overlap the light-emitting element LD and the color conversion layer CCL of the second pixel PXL2 in the third direction (i.e., Z-axis direction). The second color filter CF2 may include a color filter material that selectively transmits light of the second color (or green). For example, in case that the second pixel PXL2 is the green pixel, the second color filter CF2 may include a green color filter material.

The third color filter CF3 may overlap the light-emitting element LD and the color conversion layer CCL of the third pixel PXL3 in the third direction (i.e., Z-axis direction). The third color filter CF3 may include a color filter material that selectively transmits light of a third color (or blue). For example, in case that the third pixel PXL3 is the blue pixel, the third color filter CF3 may include a blue color filter material.

According to the above-described embodiments, the manufacturing process of the display device may be simplified by simultaneously forming the light-emitting elements LD and the bank patterns BNP. The porous area PA embedded in the light-emitting elements LD may scatter light emitted from the light-emitting area EA, thereby improving light-output efficiency. Accordingly, since the scattering layer separately provided in the pixel PXL can be omitted, the manufacturing process can be simplified and cost can be reduced. Since the porous area PA may be provided between the light-emitting area EA and the color conversion layer CCL, it may be possible to effectively prevent the color conversion layer CCL from being damaged due to heat generation of the light-emitting area EA.

Hereinafter, additional embodiments will be described. The same components as components described above will be referred to the same reference numerals in embodiments below, and redundant descriptions will be omitted or simplified.

Figure 5:
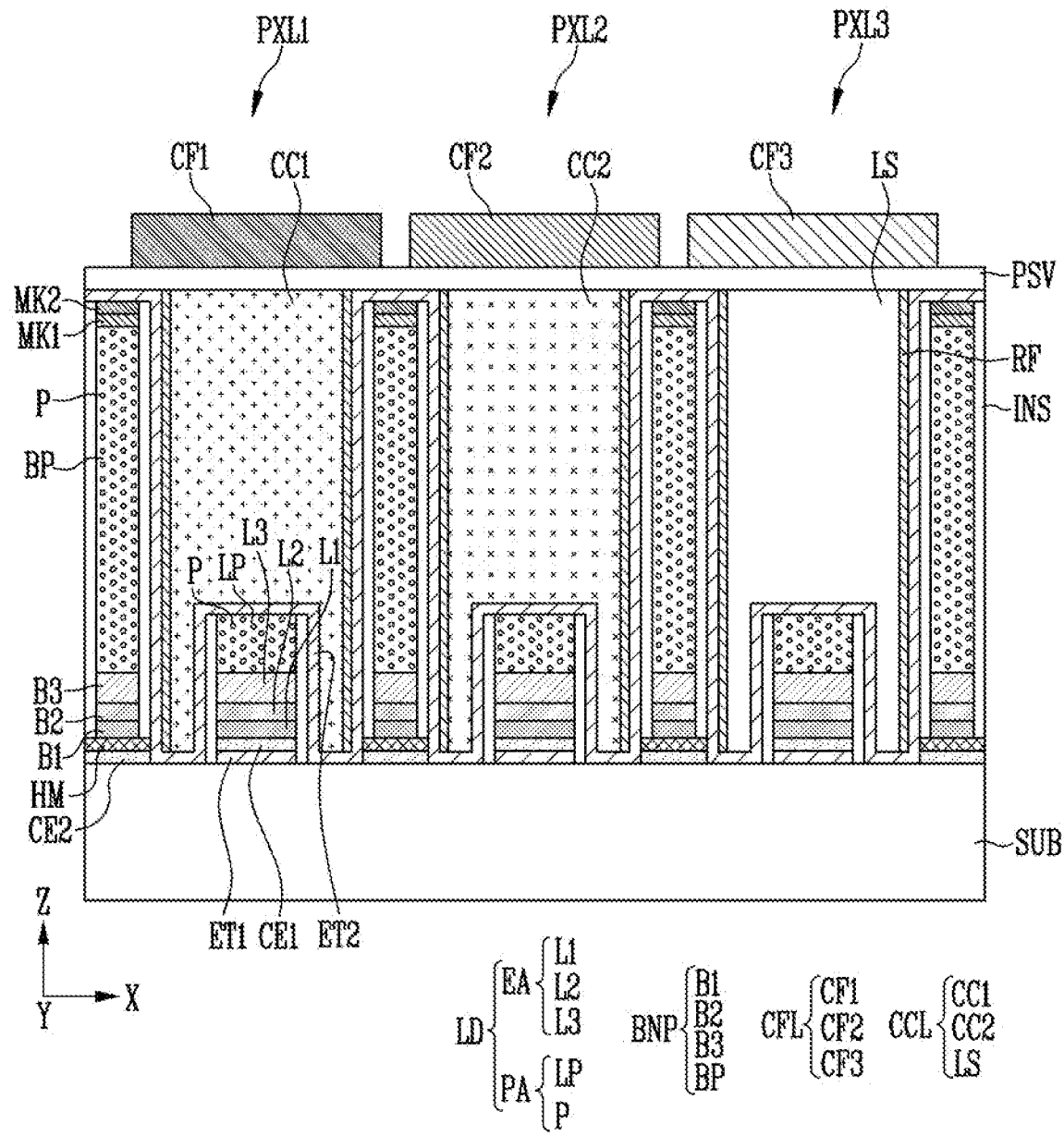
FIG. 5 is a schematic cross-sectional view illustrating a pixel according to another embodiment.

FIG. 5 is a schematic cross-sectional view illustrating a pixel according to another embodiment.

Referring to FIG. 5, the color conversion layer CCL according to an embodiment may be distinguished from the embodiments of FIGS. 1 to 4 in that an embodiment may include the first color conversion layer CC1 disposed in the first pixel PXL1, the second color conversion layer disposed in the second pixel PXL2, and a light transmitting layer LS disposed in the third pixel PXL3.

In an embodiment, the first to third pixels PXL1, PXL2, and PXL3 may include light-emitting elements LD that emit light of the same color. For example, the first to third pixels PXL1, PXL2, and PXL3 may include light-emitting elements LD that emit light of a third color (or blue). The color conversion layer CCL including color conversion particles may be disposed on the first to third pixels PXL1, PXL2, and PXL3, thereby displaying a full-color image.

In case that the first pixel PXL1 is the red pixel, the first color conversion layer CC1 may include a first quantum dot that converts blue light emitted from the blue light-emitting element into red light. The first quantum dot may absorb blue light and shift a wavelength according to an energy transition to emit red light. In case that the first pixel PXL1 is a pixel of a different color, the first color conversion layer CC1 may include the first quantum dot corresponding to the color of the first pixel PXL1.

In case that the second pixel PXL2 is the green pixel, the second color conversion layer CC2 may include a second quantum dot that converts blue light emitted from the blue light-emitting element into green light. The second quantum dot may absorb blue light and shift a wavelength according to energy transition to emit green light. In case that the second pixel PXL2 is a pixel of a different color, the second color conversion layer CC2 may include the second quantum dot corresponding to the color of the second pixel PXL2.

The blue light having a relatively short wavelength in the visible light range may be injected to the first quantum dot and the second quantum dot, thereby increasing absorption coefficients of the first quantum dot and the second quantum dot. Accordingly, the light efficiency emitted from the first pixel PXL1 and the second pixel PXL2 may be improved, and excellent color reproducibility may be secured finally. The light-emitting unit EMU of the first to third pixels PXL1, PXL2, and PXL3 may be composed of the light-emitting elements LD (e.g., blue light-emitting elements) of the same color, thereby manufacturing efficiency of the display device can be increased.

The light transmitting layer LS may be provided to efficiently use the light of the third color (or blue) emitted from the light-emitting element LD. For example, in case that the light-emitting element LD is a blue light-emitting element emitting blue light and the third pixel PXL3 is the blue pixel, the light transmitting layer LS may include light scattering particles to efficiently use light emitted from the light-emitting element LD, but is not limited thereto. According to embodiments, the light transmitting layer LS may be omitted or a transparent polymer may be provided instead of the light transmitting layer LS.

Figure 6:
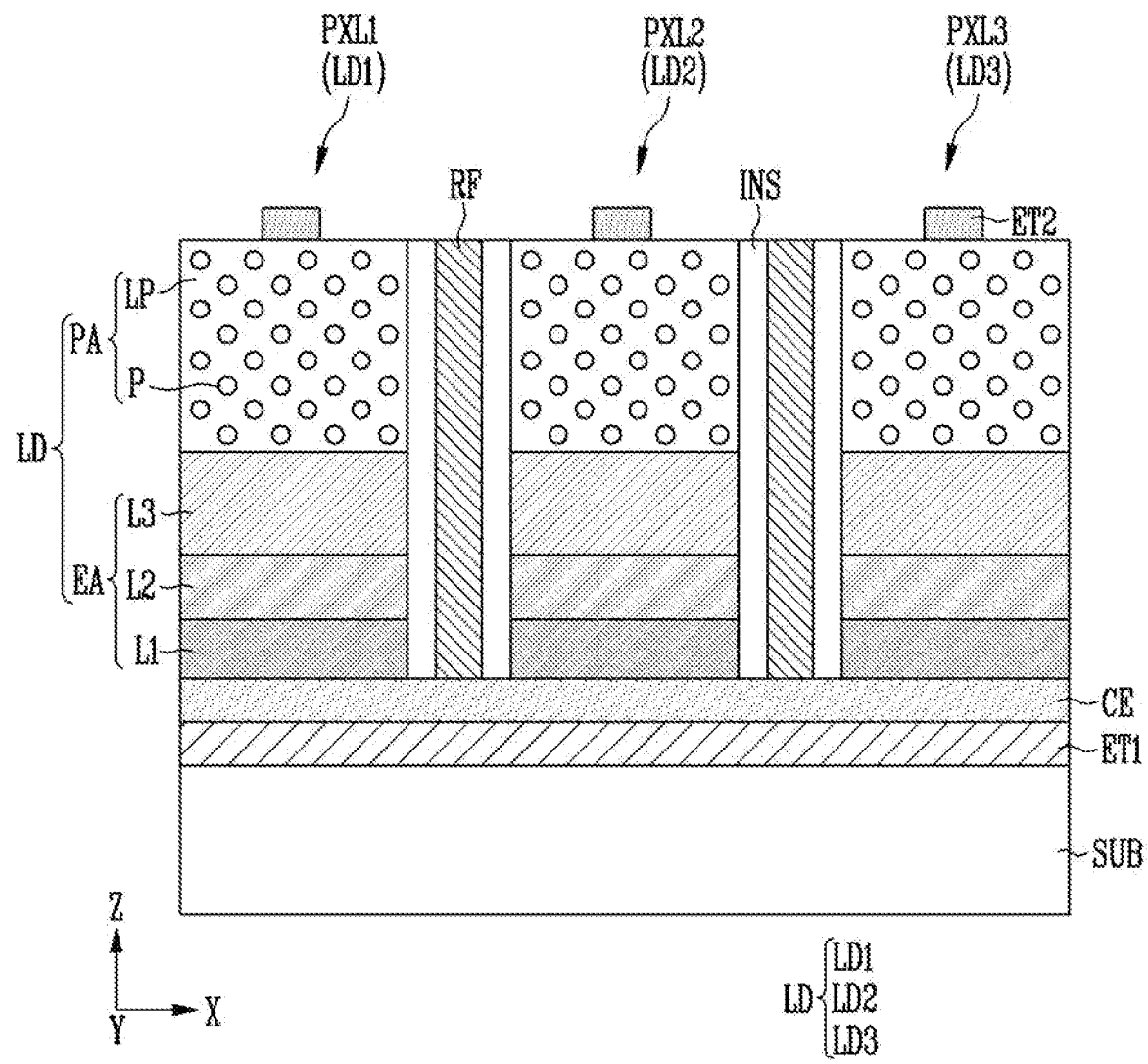
FIG. 6 is a schematic cross-sectional view illustrating a pixel according to another embodiment.

FIG. 6 is a schematic cross-sectional view illustrating a pixel according to another embodiment.

Referring to FIG. 6, the first to third pixels PXL1, PXL2 and PXL3 according to an embodiment may be distinguished from the embodiments of FIGS. 1 to 5 in that an embodiment may include first to third light-emitting elements LD1, LD2 and LD3, respectively, and the color conversion layer CCL (see FIG. 3) and the like and the bank patterns BNP (see FIG. 3) may be omitted.

Specifically, the light-emitting elements LD may include the first light-emitting element LD1 disposed in the first pixel PXL1, the second light-emitting element LD2 disposed in the second pixel PXL2, and the third light-emitting element LD3 disposed in the third pixel PXL3.

Each of the first to third light-emitting elements LD1, LD2, and LD3 may include a light-emitting area EA and a porous area PA. The light-emitting area EA may be provided between the substrate SUB and the porous area PA.

The light-emitting area EA of each of the first to third light-emitting elements LD1, LD2, and LD3 may emit light of different colors. For example, the first light-emitting element LD1 may include a light-emitting area EA emitting the first color (or red), the second light-emitting element LD2 may include a light-emitting area EA emitting the second color (or green), and the third light-emitting element LD3 may include a light-emitting area EA emitting the third color (or blue). As described above, since each of the first to third light-emitting elements LD1, LD2, and LD3 includes the light-emitting area EA emitting light of different colors, a full color image can be displayed. Accordingly, since the color conversion layer and/or the color filter layer separately provided in each of the first to third pixels PXL1, PXL2, and PXL3 may be omitted, the manufacturing process may be simplified and cost may be reduced.

The light-emitting area EA may include a first semiconductor layer L1, a second semiconductor layer L3, and an active layer L2 interposed between the first and second semiconductor layers L1 and L3. For example, the first semiconductor layer L1, the active layer L2, and the second semiconductor layer L3 of each of the first to third light-emitting elements LD1, LD2, and LD3 may be sequentially stacked on the substrate SUB in the third direction. (i.e., Z-axis direction).

The first semiconductor layer L1 of each of the first to third light-emitting elements LD1, LD2, and LD3 may include at least one p-type semiconductor layer. For example, the first semiconductor layer L1 may include a semiconductor material such as GaN, InGaN, InAlGaN, AlGaN, AlN, AlGaAs, GaAsP, AlGaInP, GaP, and the like, or a combination thereof, and may include a p-type semiconductor layer doped with a first conductive dopant (or a p-type dopant) such as Mg, Zn, Ca, Sr, Ba, and the like, or a combination thereof. For example, the first semiconductor layer L1 may include a GaN semiconductor material doped with the first conductive dopant (or the p-type dopant), but is not limited thereto and the first semiconductor layer L1 may be formed of various materials.

The active layer L2 of each of the first to third light-emitting elements LD1, LD2, and LD3 may be disposed between the first semiconductor layer L1 and the second semiconductor layer L3. The active layer L2 may include at least one of a single well structure, a multi well structure, a single quantum well structure, a multi quantum well (MQW) structure, a quantum dot structure, and a quantum wire structure, but is not limited thereto. The active layer L2 may include GaN, InGaN, InAlGaN, AlGaN, AlN, AlGaAs, GaAsP, AlGaInP, GaP, or a combination thereof. Various materials may constitute the active layer L2.

In case that a signal (or voltage) is applied to each end of the first to third light-emitting elements LD1, LD2 and LD3, the light-emitting element LD emits light while the electron-hole pairs combine in the active layer L2 of each of the first to third light-emitting elements LD1, LD2 and LD3. By controlling the light-emitting of each light-emitting element LD using this principle, the light-emitting element LD can be used as a light source of various light-emitting elements including the pixel PXL of a display device.

According to embodiments, an electron blocking layer (EBL) may be further disposed between the active layer L2 and the first semiconductor layer L1. The electron blocking layer may block the flow of electrons supplied from the second semiconductor layer L3 from escaping to the first semiconductor layer L1, thereby increasing the electron-hole recombination probability in the active layer L2. The energy bandgap of the electron blocking layer may be greater than that of the active layer L2 and/or the first semiconductor layer L1, but is not limited thereto.

According to embodiments, a super lattices layer (SLs) may be further disposed between the active layer L2 and the second semiconductor layer L3. The super lattice layer may relieve the stress of the active layer L2 and the second semiconductor layer L3 to improve the quality of the light-emitting elements LD. The super lattice layer may be formed in a structure in which InGaN and GaN are alternately stacked, but is not limited thereto.

The second semiconductor layer L3 of each of the first to third light-emitting elements LD1, LD2, and LD3 may be disposed on the active layer L2, and may include a semiconductor layer of a different type from the first semiconductor layer L1. In an embodiment, the second semiconductor layer L3 may include at least one n-type semiconductor layer. For example, the second semiconductor layer L3 may include a semiconductor material such as GaN, InGaN, InAlGaN, AlGaN, AlN, AlGaAs, GaAsP, AlGaInP, GaP, and the like, or a combination thereof, and may be a n-type semiconductor layer doped with a second conductive dopant (or an n-type dopant) such as Si, Ge, Sn, and the like, or a combination thereof. For example, the second semiconductor layer L3 may include a GaN semiconductor material doped with a second conductive dopant (or an n-type dopant). However, the material constituting the second semiconductor layer L3 is not limited thereto, and in addition, the second semiconductor layer L3 of the light-emitting elements LD may be formed of various materials.

The porous area PA of each of the first to third light-emitting elements LD1, LD2, and LD3 may be provided on the second semiconductor layer L3 of the light-emitting area EA. For example, the porous area PA may be directly formed on the second semiconductor layer L3 of the light-emitting area EA. The porous area PA may include the same material as the second semiconductor layer L3, but is not limited thereto.

The porous area PA may include a porous layer LP and a plurality of pores P present in the porous layer LP. The porous area PA may be provided on the light-emitting area EA to scatter light emitted from the light-emitting area EA, thereby improving light-output efficiency. For example, the refractive index of the porous area PA may be reduced due to the plurality of pores P, thereby increasing light extraction efficiency. For example, the porous area PA may function as a scattering layer. As described above, in case that the porous area PA is included in the light-emitting elements LD, the scattering layer separately provided in the pixel PXL may be omitted, thereby simplifying the manufacturing process and reducing costs. Since the porous area PA including the porous layer LP and the pores P have been described in detail with reference to FIG. 3 and the like, duplicate descriptions will be omitted.

Each of the first to third light-emitting elements LD1, LD2, and LD3 may be disposed on the first electrode ET1 provided on the substrate SUB. For example, the first semiconductor layer L1 of the light-emitting elements LD may be disposed on the first electrode ET1 to be electrically connected to the first electrode ET1.

According to embodiments, a connection electrode CE may be further disposed between the substrate SUB and the light-emitting elements LD. The connection electrode CE may be disposed between the first semiconductor layer L1 of the light-emitting elements LD and the first electrode ET1 provided on the substrate SUB. The light-emitting elements LD may be electrically connected to the first electrode ET1 provided on the substrate SUB through the connection electrode CE. The connection electrode CE may include a metal or a metal oxide. For example, the connection electrode CE may include copper (Cu), gold (Au), chromium (Cr), titanium (Ti), aluminum (Al), nickel (Ni), indium tin oxide (ITO), oxides or alloys thereof, and the like, but is not necessarily limited thereto.

An insulating layer INS and a reflective layer RF may be disposed between the first to third light-emitting elements LD1, LD2, and LD3. The insulating layer INS may be provided between the light-emitting elements LD and the reflective layer RF.

The insulating layer INS may be provided on the surfaces of the light-emitting elements LD. The insulating layer INS may be provided on side surfaces of the light-emitting elements LD. The insulating layer INS may prevent an electrical short that may occur in case that the active layer L2 of the light-emitting elements LD contacts conductive materials other than the first and second semiconductor layers L1 and L3. The insulating layer INS may minimize surface defects of the light-emitting elements LD, thereby improving lifespan and luminous efficiency of the light-emitting elements LD.

The insulating layer INS may cover the side surfaces of the light-emitting elements LD, but may be partially removed to expose upper surfaces of the light-emitting elements LD. For example, the insulating layer INS may cover the side surfaces of the light-emitting elements LD, but may be partially removed to expose a surface of the porous area PA of the light-emitting elements LD.

The reflective layer RF may be disposed between the light-emitting elements LD. The reflective layer RF may be disposed at a boundary between the first to third pixels PXL1, PXL2, and PXL3 on the substrate SUB. The reflective layer RF may be disposed between the light-emitting elements LD to reflect light emitted from the light-emitting elements LD, thereby improving light-output efficiency of the display panel PNL. Also, the reflective layer RF may be disposed at the boundary between the first to third pixels PXL1, PXL2, and PXL3 to prevent color mixing between adjacent pixels PXL.

A second electrode ET2 may be disposed on each of the first to third light-emitting elements LD1, LD2, and LD3. The second electrode ET2 may be directly disposed on upper surfaces of the light-emitting elements LD exposed by the insulating layer INS. For example, the second electrode ET2 may be directly disposed on the porous area PA of the light-emitting elements LD, that is, the porous layer LP. The second electrode ET2 may be disposed in each of the first to third pixels PXL1, PXL2, and PXL3.

According to the above-described embodiment, since each of the first to third light-emitting elements LD1, LD2, and LD3 includes the light-emitting area EA emitting light of different colors, the color conversion layer and/or the color filter layer may be omitted, and thus the manufacturing process may be simplified and cost may be reduced. As described above, the porous area PA may be embedded in the light-emitting elements LD to improve light-output efficiency of the display panel PNL and to simplify the manufacturing process simultaneously.

Subsequently, a manufacturing method of the display device according to the above-described embodiments will be described.

FIGS. 7 to 16 are schematic cross-sectional views illustrating steps of a manufacturing method of a display device according to an embodiment. FIGS. 7 to 16 are cross-sectional views for illustrating the manufacturing method of the display device of FIG. 3, and constituent elements substantially the same as those of FIG. 3 are denoted by the same reference numerals and detailed reference numerals are omitted in FIGS. 7 to 16.

Figure 7:
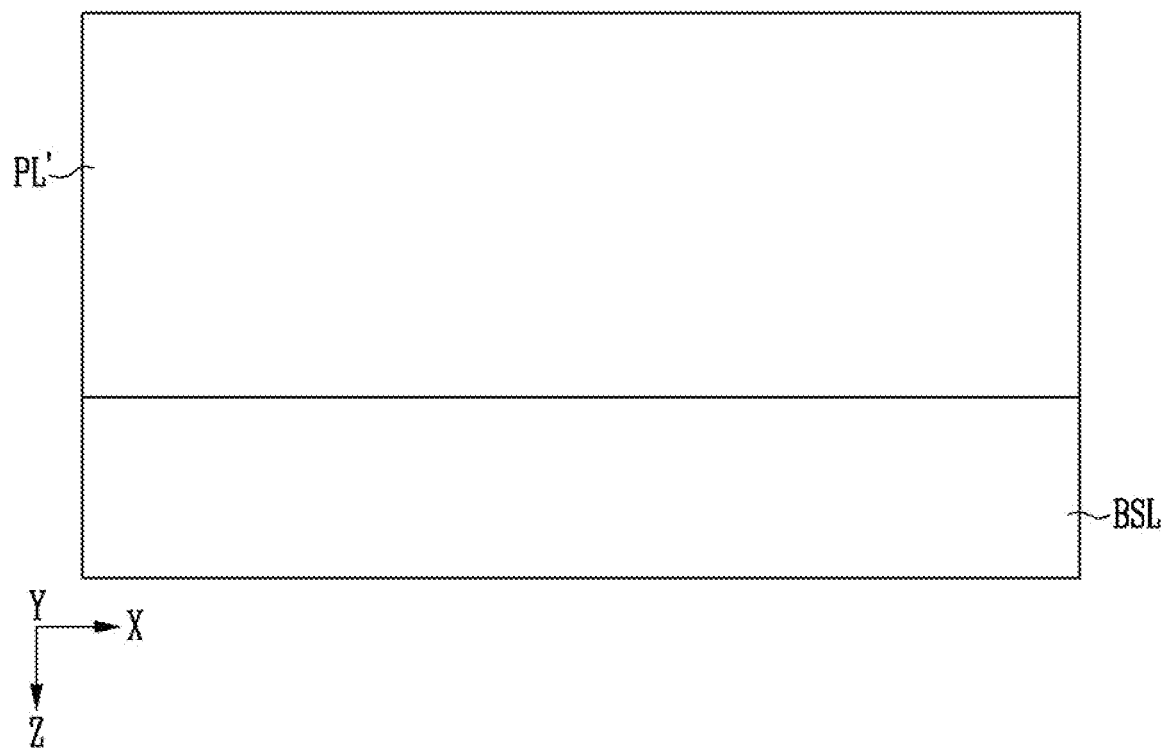
FIGS. 7 to 16 are schematic cross-sectional views illustrating steps of a manufacturing method of a display device according to an embodiment.

Referring to FIG. 7, first, a base layer BSL may be prepared, and a semiconductor layer PL' may be formed on the base layer BSL. The base layer BSL may use a sapphire substrate, a silicon (Si) substrate, a silicon carbide (SiC) substrate, or a combination thereof, but is not limited thereto, and a single crystal substrate having a lattice structure may be used. The base layer BSL may further include a buffer layer formed on a surface thereof.

The semiconductor layer PL' may include at least one n-type semiconductor layer. For example, the semiconductor layer PL' may include a semiconductor material such as GaN, InGaN, InAlGaN, AlGaN, AlN, or a combination thereof, and may be an n-type semiconductor layer doped with a second conductive dopant (or an n-type dopant) such as Si, Ge, Sn, and the like. For example, the semiconductor layer PL' may include a GaN semiconductor material doped with the second conductive dopant (or the n-type dopant). However, the material constituting the semiconductor layer PL' is not limited thereto, and the semiconductor layer PL' may be formed of various other materials.

Figure 8:
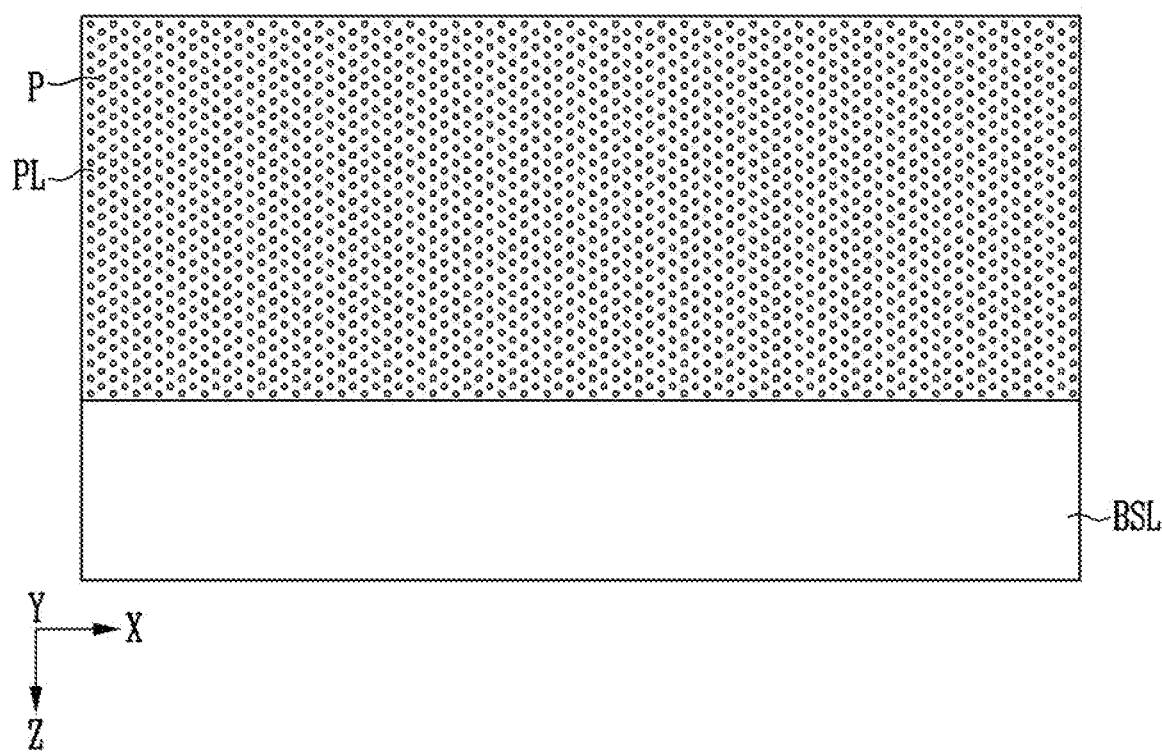

Referring to FIG. 8, the porous layer LP may be formed by etching the semiconductor layer PL'. For example, the semiconductor layer PL' may be electrochemically etched to form nanoscale pores P of the porous layer LP. During the electrochemical etching of the semiconductor layer PL', the size, shape, and distribution of the pores P may be variously adjusted according to an etchant, a voltage, and/or a doping concentration.

Figure 9:
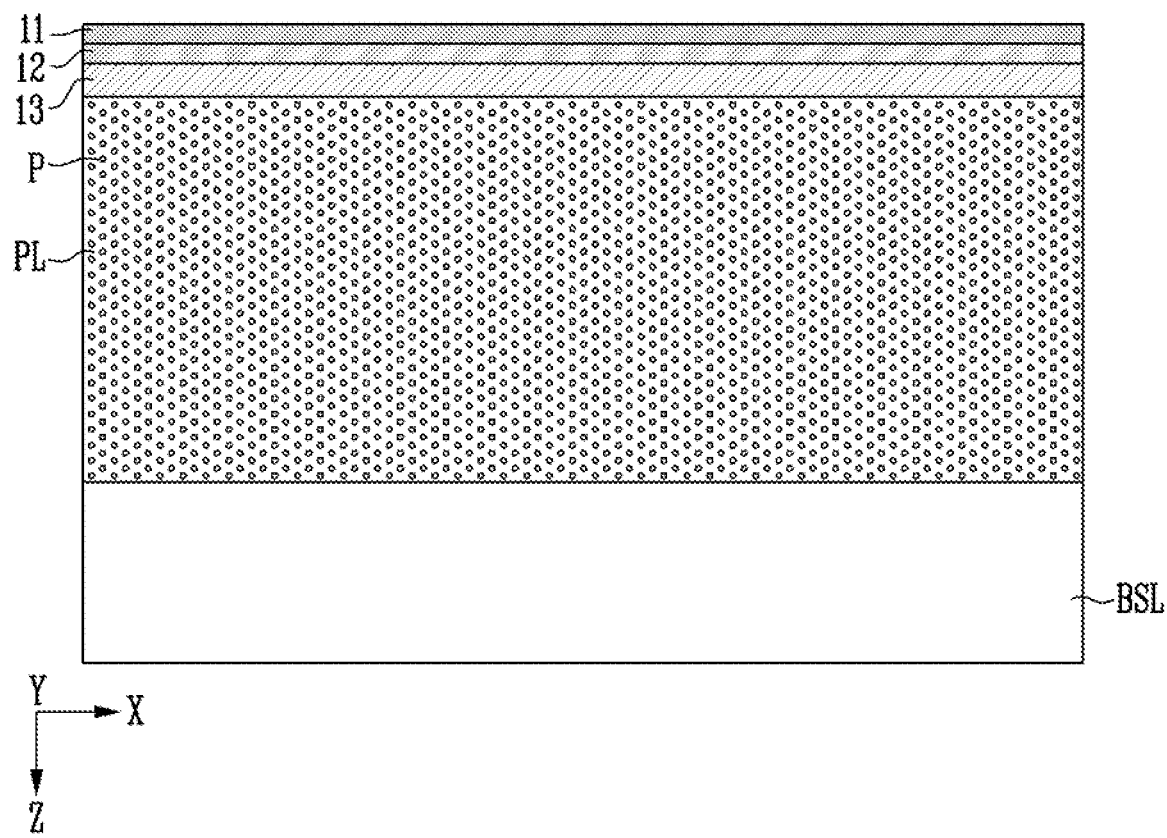

Referring to FIG. 9, the light-emitting stacks 11, 12, and 13 may be formed on the porous layer LP. The light-emitting stacks 11, 12, and 13 may be formed by growing seed crystals by an epitaxial method. In this case, since the stress of the light-emitting stacks 11, 12, and 13 may be relieved by the porous structure of the porous layer LP, the quality of the light-emitting elements LD may be improved.

According to embodiments, the light-emitting stacks 11, 12, and 13 may be formed by metal organic chemical vapor deposition (MOCVD). However, the disclosure is not necessarily limited thereto, and the light-emitting stacks 11, 12, and 13 may be formed by various methods such as electron beam deposition, physical vapor deposition (PVD), chemical vapor deposition (CVD), plasma laser deposition (PLD), dual-type thermal evaporation, sputtering, metal organic chemical vapor deposition (MOCVD), and the like, or a combination thereof.

The light-emitting stacks 11, 12, and 13 may include an epitaxially grown first semiconductor layer 11, an active layer 12, and a second semiconductor layer 13.

The second semiconductor layer 13 may be provided on the porous layer LP and may be formed of the same material as the porous layer LP. For example, the second semiconductor layer 13 may include at least one n-type semiconductor layer. For example, the second semiconductor layer 13 may include a semiconductor material of at least one of GaN, InGaN, InAlGaN, AlGaN, and AlN, or a combination thereof, and may be an n-type semiconductor layer doped with a second conductive dopant (or an n-type dopant) such as Si, Ge, Sn, and the like. For example, the second semiconductor layer 13 may include a GaN semiconductor material doped with the second conductive dopant (or the n-type dopant). However, the material constituting the second semiconductor layer 13 is not limited thereto, and the second semiconductor layer 13 may be formed of various materials. The second semiconductor layer 13 may be directly formed on the porous layer LP, but is not limited thereto.

The active layer 12 may be provided on the second semiconductor layer 13, and may include at least one structure of a single well structure, a multi-well structure, a single quantum well structure, a multi quantum well (MQW) structure, a quantum dot structure, and a quantum line structure, but is not necessarily limited thereto. The active layer 12 may include GaN, InGaN, InAlGaN, AlGaN, AlN, or a combination thereof, and various other materials may constitute the active layer 12 of the bank patterns.

The first semiconductor layer 11 may be provided on the active layer 12 and may include at least one p-type semiconductor layer. For example, the first semiconductor layer 11 may include a semiconductor material such as GaN, InGaN, InAlGaN, AlGaN, AlN, or a combination thereof, and may include a p-type semiconductor layer doped with the first conductive dopant (or the p-type dopant) such as Mg, Zn, Ca, Sr, Ba, and the like, or a combination thereof. For example, the first semiconductor layer 11 may include a GaN semiconductor material doped with the first conductive dopant (or the p-type dopant), but is not necessarily limited thereto, and the first semiconductor layer L1 may be formed of various materials.

Figure 10:
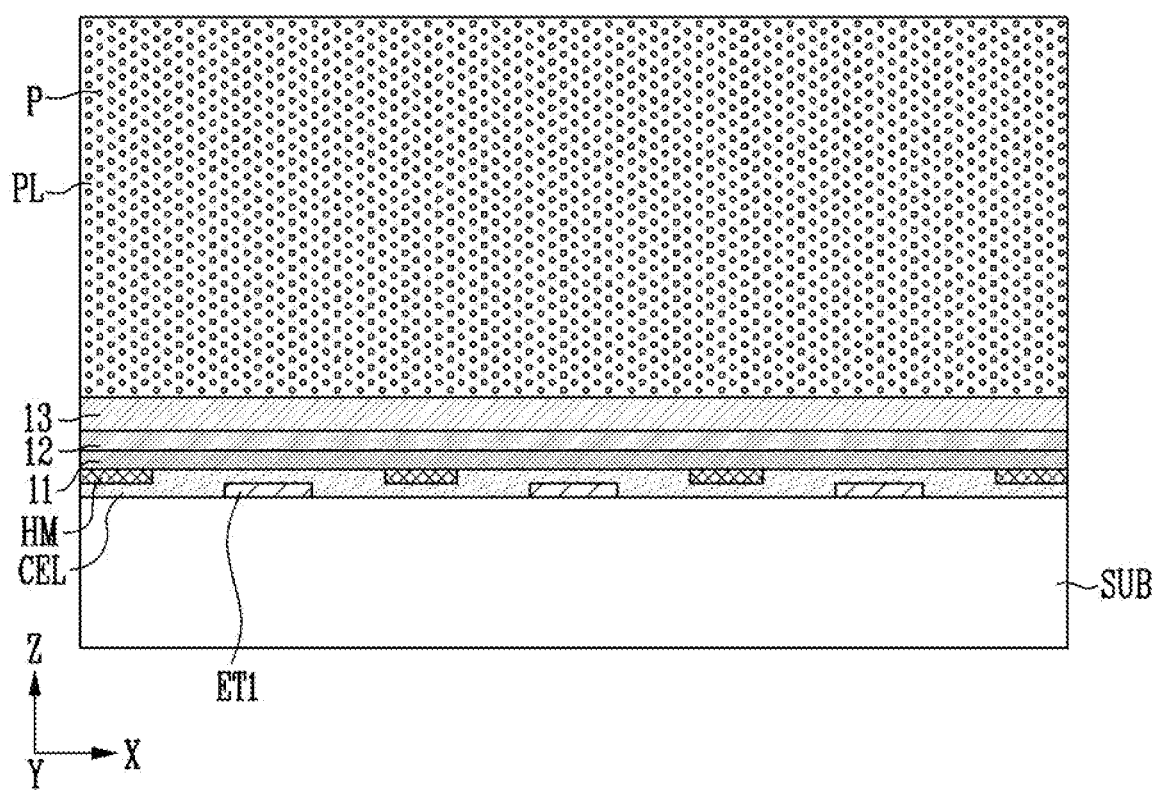

Referring to FIG. 10, the light-emitting stacks 11, 12, and 13 and the porous layer LP may then be bonded to the substrate SUB. The substrate SUB may be a driving substrate including circuit elements including transistors constituting the pixel circuit PXC (see FIG. 2) of each pixel PXL, and a first electrode ET1, a connection electrode layer CEL, and/or a hard mask layer HM may be provided on the substrate SUB.

The first electrode ET1 may be formed at a position where light-emitting elements LD, which will be described later, may be provided. The connection electrode layer CEL may be formed over the entire surface of the substrate SUB, but is not limited thereto. The hard mask layer HM may be formed at a position where the bank patterns BNP will be provided to form a lower end of the bank patterns BNP, which will be described later. However, the disclosure is not necessarily limited thereto, and the hard mask layer HM may be omitted according to embodiments.

The first semiconductor layer 11 of the light-emitting stacks 11, 12, and 13 may be combined to the first electrode ET1 formed on the substrate SUB. The first semiconductor layer 11 may be easily bonded to the first electrode ET1 provided on the substrate SUB through the connection electrode layer CEL. The connection electrode layer CEL may be formed of a metal or a metal oxide.

After the light-emitting stacks 11, 12, and 13 and the porous layer LP may be bonded to the substrate SUB, the base layer BSL may be separated from a surface of the porous layer LP.

Figure 11:
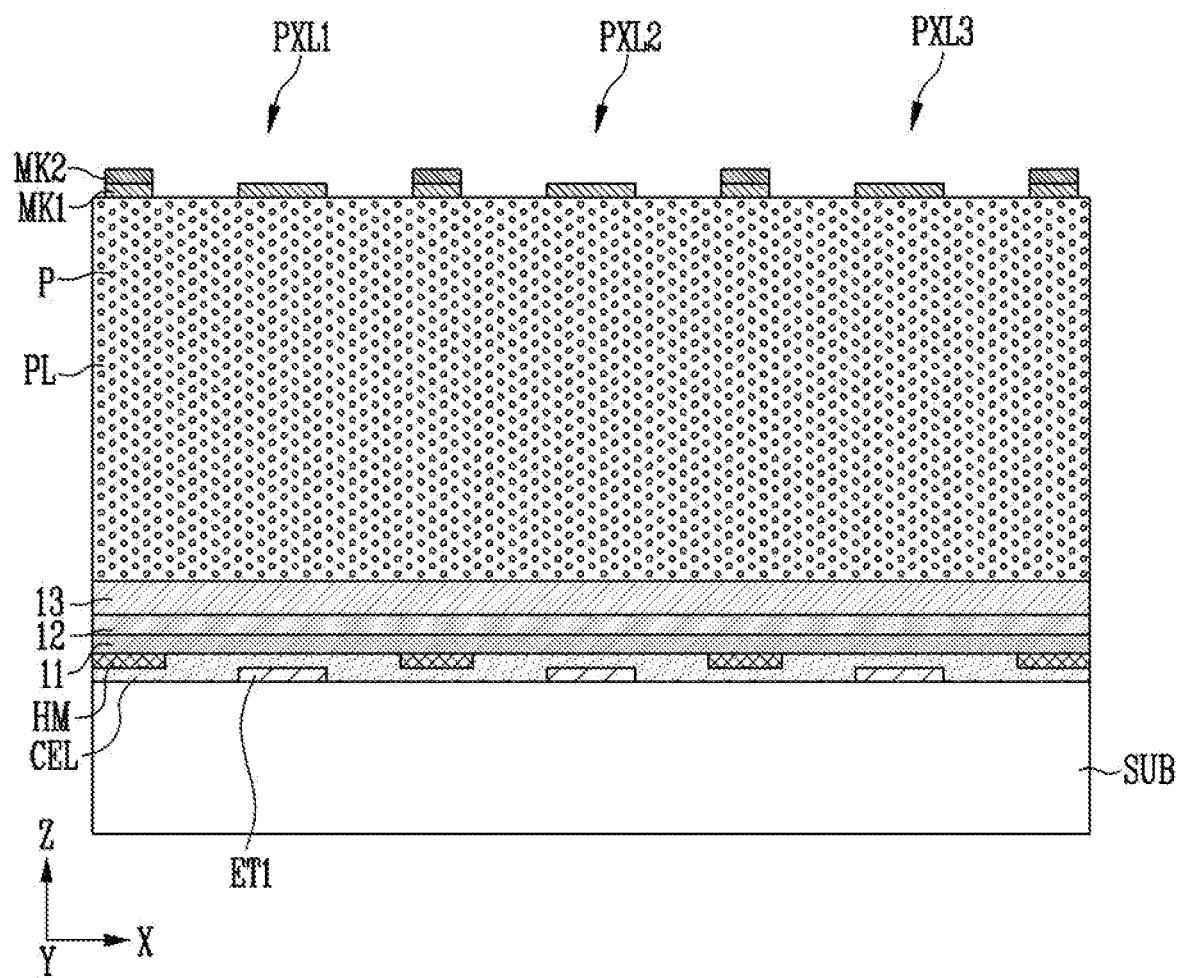

Referring to FIG. 11, first and second mask layers MK1 and MK2 may be formed on the light-emitting stacks 11, 12, and 13 and the porous layer LP. The first and second mask layers MK1 and MK2 may be directly formed on the porous layer LP, but are not limited thereto.

The first mask layer MK1 may be partially formed at a position where light-emitting elements LD and bank patterns BNP, which will be described later, are provided. The second mask layer MK2 may be formed on the first mask layer MK1. The second mask layer MK2 may be selectively formed at positions where the bank patterns BNP are to be provided.

The first mask layer MK1 and the second mask layer MK2 may be formed of different materials. For example, the first mask layer MK1 may include silicon oxide (SiOx), and the second mask layer MK2 may include nickel (Ni), but are not limited thereto.

Figure 12:
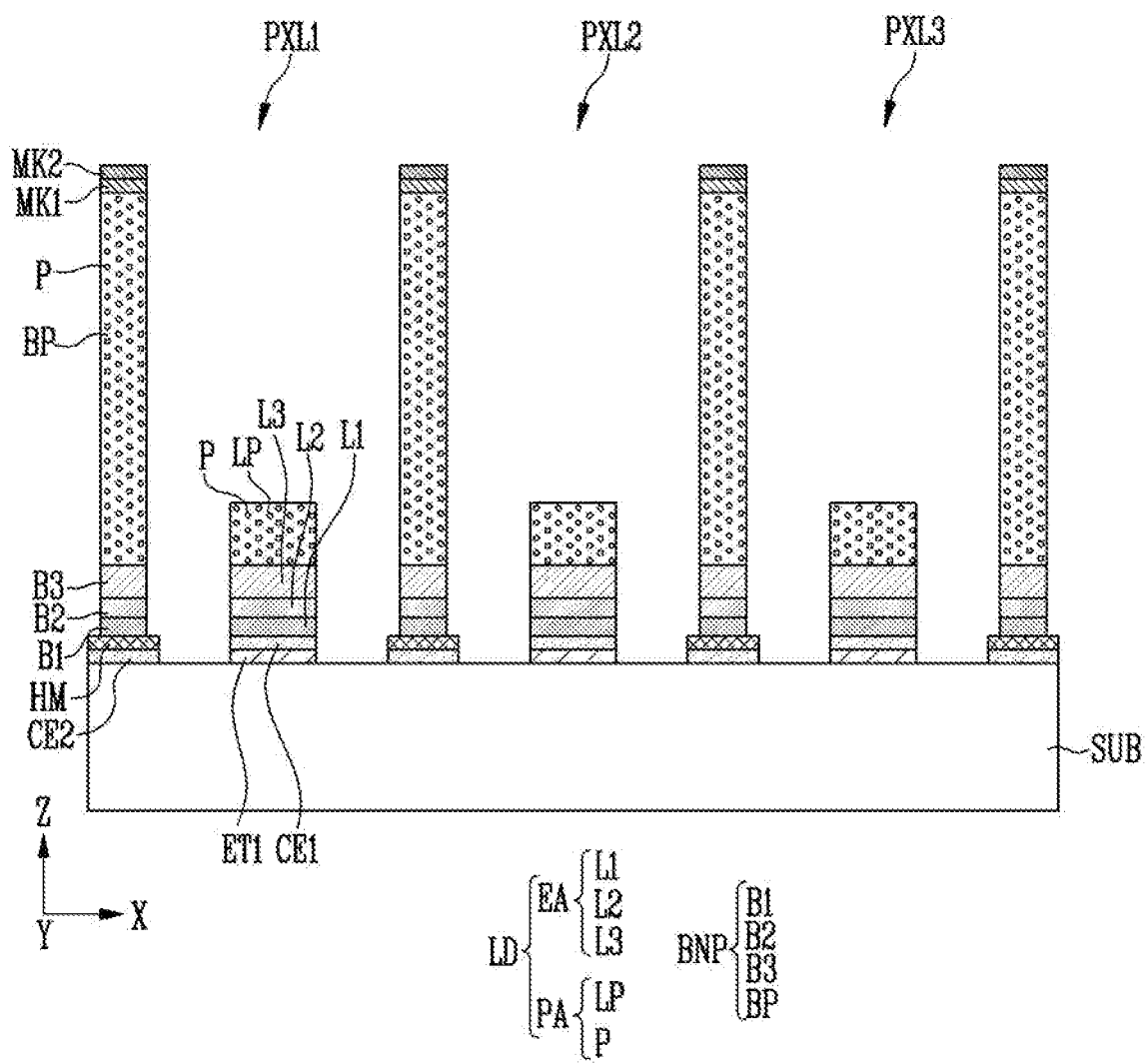

Referring to FIG. 12, the light-emitting stacks 11, 12, and 13 and the porous layer LP may be patterned to form light-emitting elements LD and bank patterns BNP. The bank patterns BNP may be formed at a boundary between the first to third pixels PXL1, PXL2, and PXL3. The light-emitting elements LD may be formed in each of the first to third pixels PXL1, PXL2, and PXL3 between the bank patterns BNP.

In the process of patterning the light-emitting stacks 11, 12, and 13 and the porous layer LP, the first semiconductor layer 11 may be separated into a first semiconductor layer L1 of the light-emitting elements LD and a first semiconductor layer B1 of the bank patterns BNP, the active layer 12 may be separated into an active layer L2 of the light-emitting elements LD and an active layer B2 of the bank patterns BNP, and the second semiconductor layer 13 may be separated into a second semiconductor layer L3 of the light-emitting elements LD and a second semiconductor layer B3 of the bank patterns BNP. Similarly, the porous layer LP may be divided into a porous layer LP of the light-emitting elements LD and a porous layer BP of the bank patterns BNP. The porous layer LP of the light-emitting elements LD may constitute the porous area PA of the light-emitting elements LD. The first semiconductor layer L1, the active layer L2, and the second semiconductor layer L3 of the light-emitting elements LD may constitute the light-emitting area EA of the light-emitting elements LD.

In the process of patterning the light-emitting stacks 11, 12, and 13 and the porous layer LP, the light-emitting elements LD and the bank patterns BNP having different thicknesses may be simultaneously formed by using the difference in etch selectivity between the first mask layer MK1 and the second mask layer MK2.

According to embodiments, in the process of patterning the light-emitting stacks 11, 12, 13 and the porous layer LP, the connection electrode layer CEL may be separated into the first connection electrode CE1 and the second connection electrode CE2. For example, the connection electrode layer CEL may be separated into a first connection electrode CE1 under the light-emitting elements LD and a second connection electrode CE2 under the hard mask layer HM.

Figure 13:
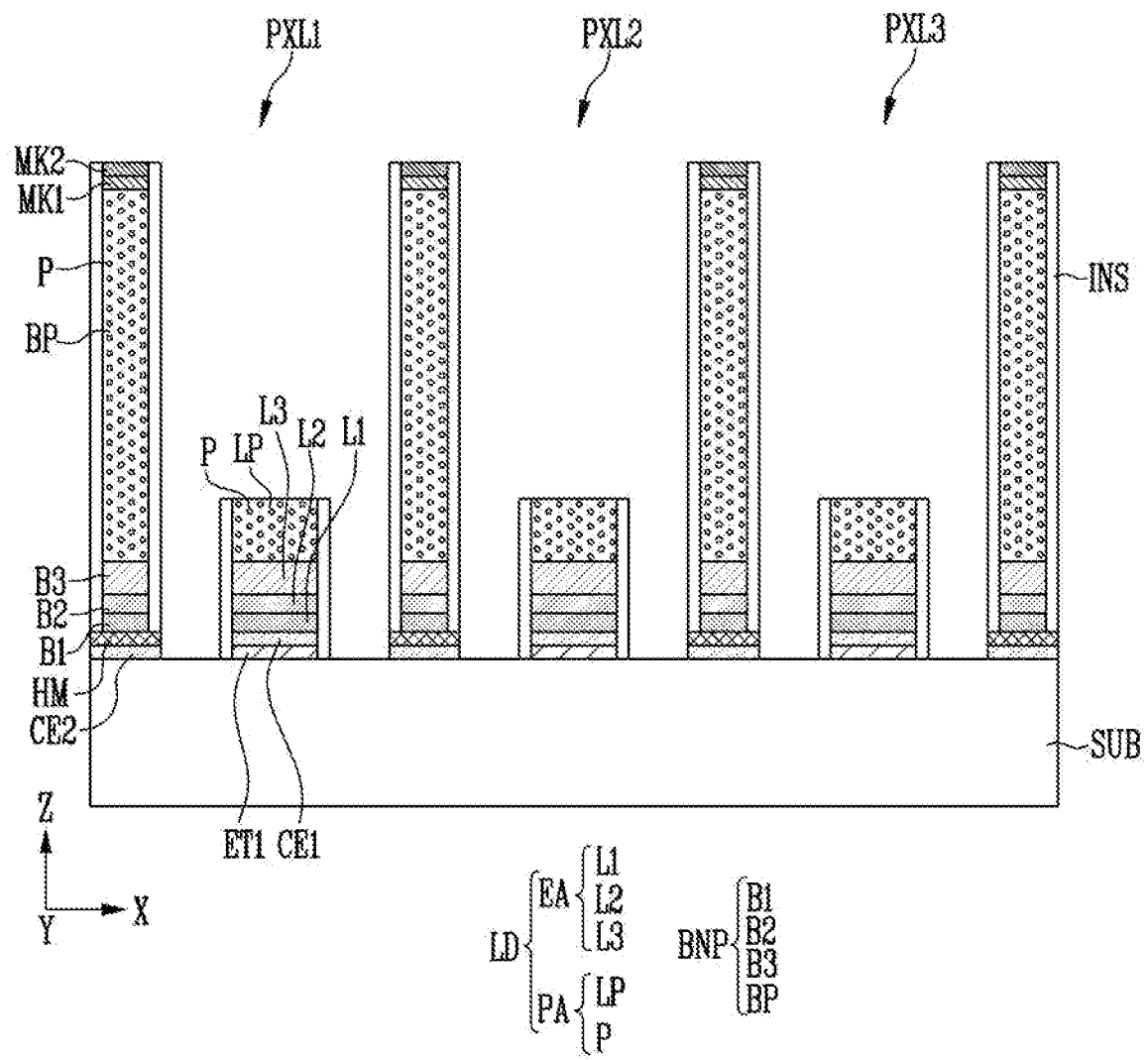

Referring to FIG. 13, an insulating layer INS may be formed on the light-emitting elements LD and/or the bank patterns BNP. The insulating layer INS may be partially formed on side surfaces of the light-emitting elements LD and/or the bank patterns BNP. After the insulating layer INS may be formed over the first to third pixels PXL1, PXL2, and PXL3, the insulating layer INS may be partially removed to expose upper surfaces of the light-emitting elements LD and/or the bank patterns BNP. In an embodiment, in case that the light-emitting elements LD and/or the bank patterns BNP are formed in the third direction (i.e., Z-axis direction), that is, perpendicular to the substrate SUB, the insulating layer INS provided on the upper surfaces of the light-emitting elements LD and/or the bank patterns BNP may be etched without a mask.

Figure 14:
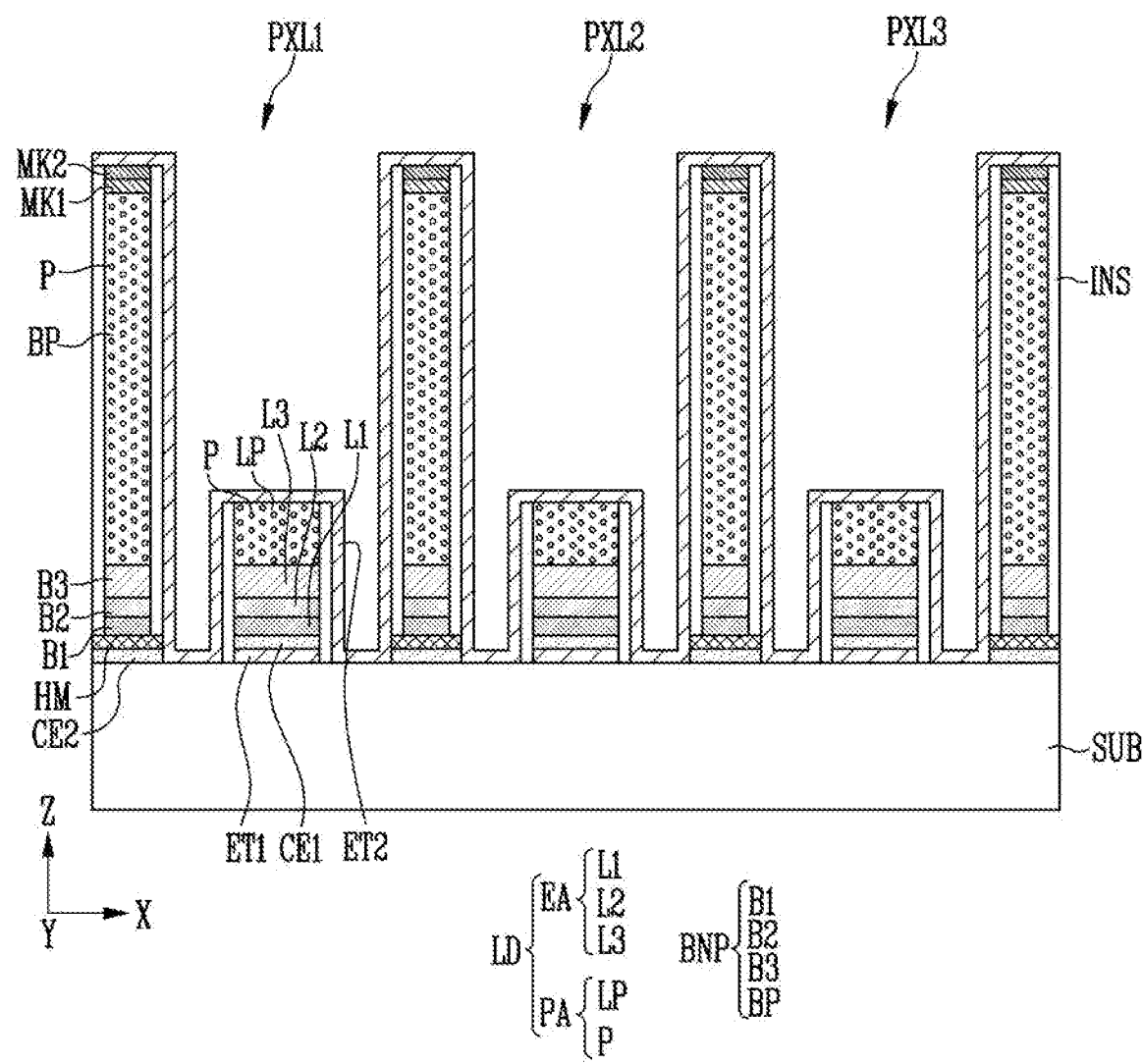

Referring to FIG. 14, a second electrode ET2 may be formed on the light-emitting elements LD. The second electrode ET2 may be directly formed on the upper surfaces of the light-emitting elements LD exposed by the insulating layer INS and may be in contact with the porous layer LP of the light-emitting elements LD.

The second electrode ET2 may be formed over the first to third pixels PXL1, PXL2, and PXL3. For example, the second electrode ET2 may be formed to cover the bank patterns BNP at least partially, but is not limited thereto.

The second electrode ET2 may be formed of various transparent conductive materials. For example, the second electrode ET2 may be formed of at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), or gallium tin oxide (GTO), and may be implemented to be substantially transparent or translucent to satisfy a light transmittance. Accordingly, the light emitted from the light-emitting elements LD may pass through the second electrode ET2 and be emitted to the outside of the display panel PNL.

Figure 15:
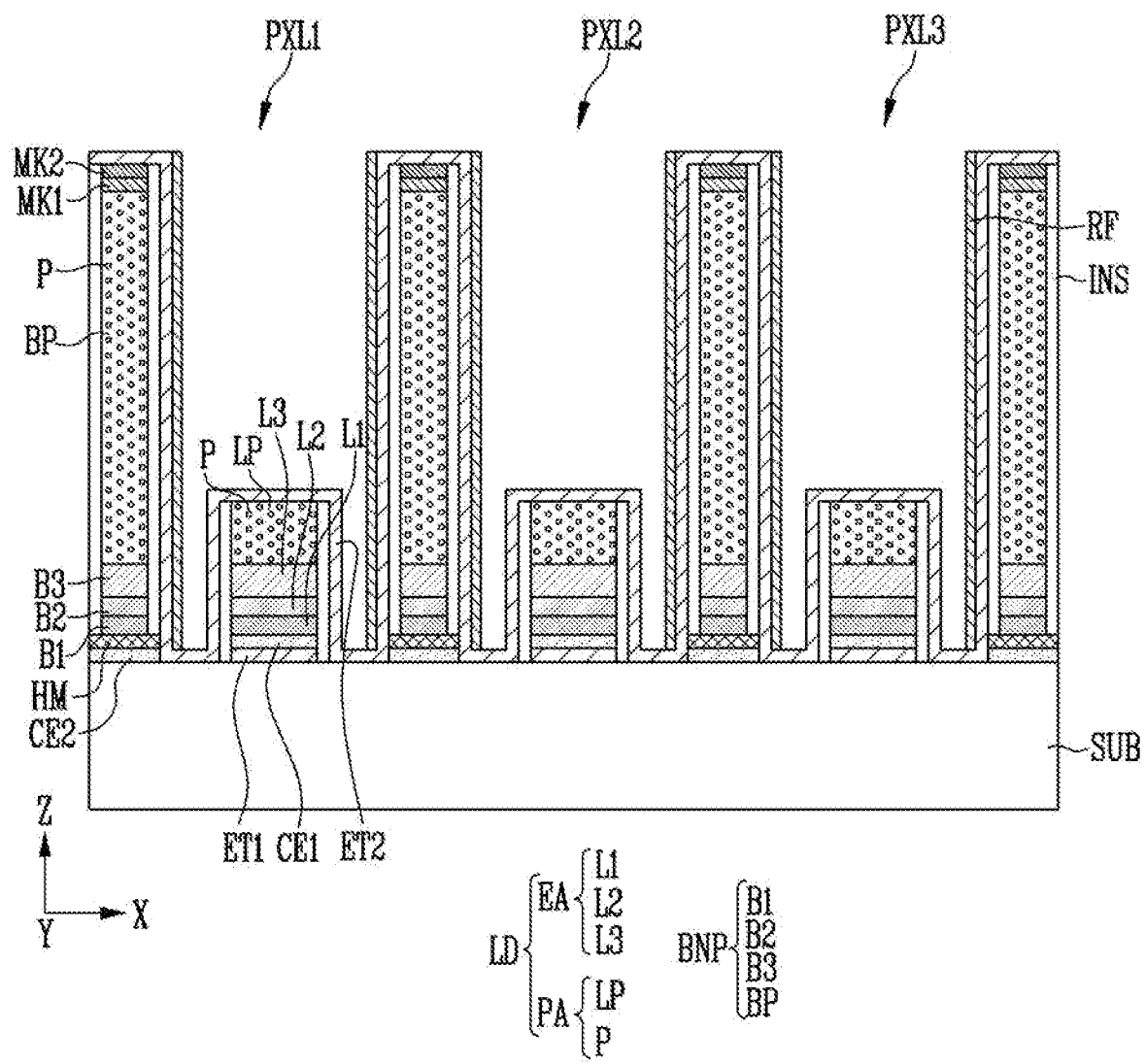

Referring to FIG. 15, a reflective layer RF may be then formed on the bank patterns BNP. The reflective layer RF may be partially formed on side surfaces of the bank patterns BNP. The reflective layer RF may reflect light emitted from the light-emitting elements LD to improve light-output efficiency of the display panel PNL. The reflective layer RF may be disposed on side surfaces of the bank patterns BNP to prevent color mixing between adjacent pixels PXL. The material of the reflective layer RF is not particularly limited and may be formed of various reflective materials.

Figure 16:
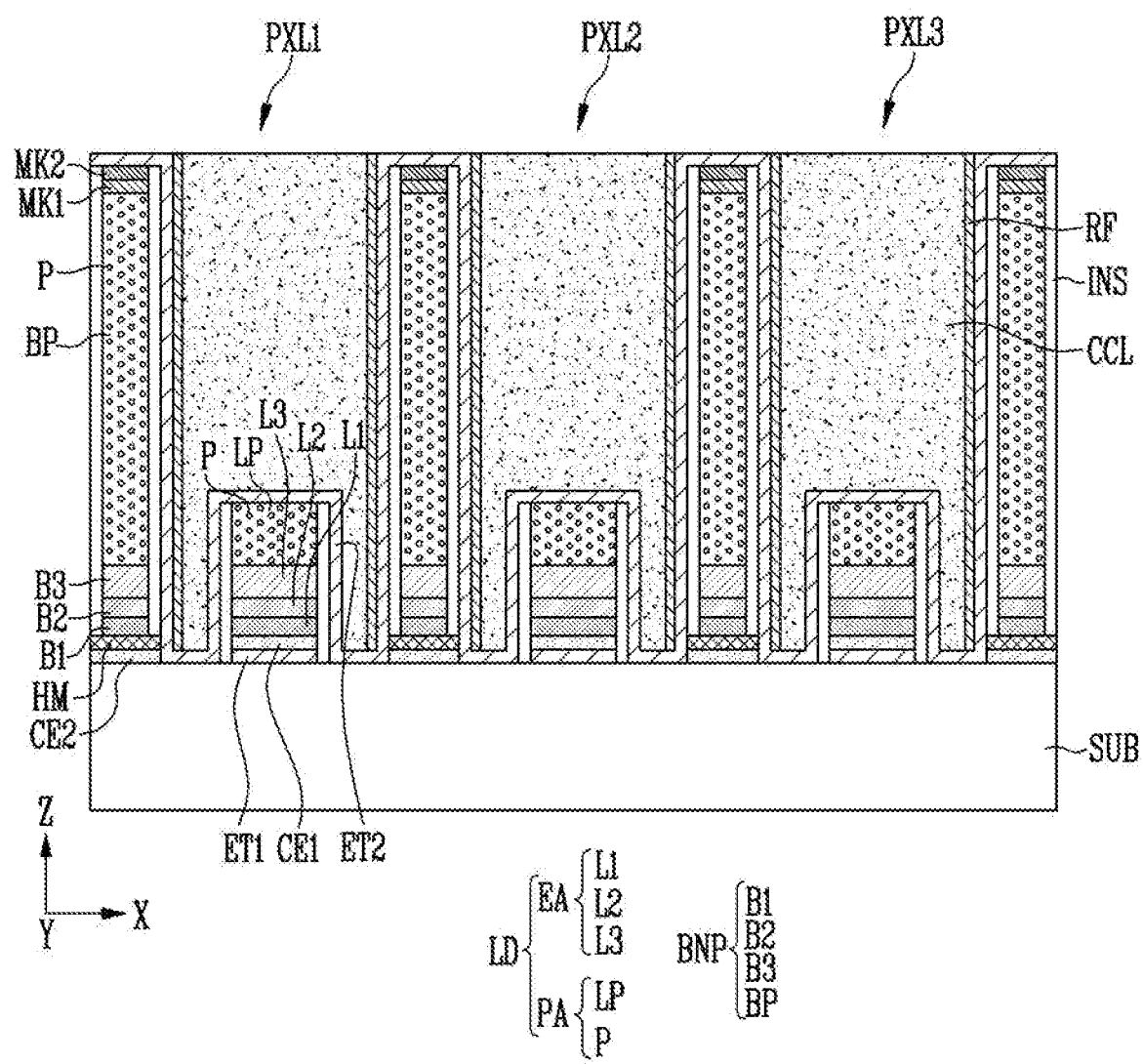

Referring to FIG. 16, a color conversion layer CCL may be then formed on the light-emitting elements LD. The color conversion layer CCL may be formed between the bank patterns BNP. For example, the color conversion layer CCL may be formed in a space or an opening defined by the bank patterns BNP. The color conversion layer CCL may include quantum dots as a color conversion material that converts light emitted from the light-emitting elements LD of each pixel PXL into light of a specific color. Since the color conversion layer CCL has been described in detail with reference to FIG. 3 and the like, duplicate descriptions will be omitted.

Subsequently, the display device of FIG. 3 may be completed by forming a passivation layer PSV1 and a color filter layer CFL on the color conversion layer CCL. The passivation layer PSV may be formed over the first to third pixels PXL1, PXL2, and PXL3. The passivation layer PSV may directly cover the color conversion layer CCL. The passivation layer PSV may prevent impurities such as moisture or air from penetrating from the outside and damaging or contaminating the color conversion layer CCL.

The color filter layer CFL may include color filters CF1, CF2, and CF3 corresponding to the color of each pixel PXL. Since the color filter layer CFL has been described in detail with reference to FIG. 3 and the like, duplicate descriptions will be omitted.

According to the above-described embodiments, the manufacturing process of the display device may be simplified by simultaneously forming the light-emitting elements LD and the bank patterns BNP. As described above, the porous area PA may be embedded in the light-emitting elements LD to improve light-output efficiency of the display panel PNL and to simplify the manufacturing process simultaneously.

Hereinafter, another embodiment will be described. The same components as components described above will be referred to the same reference numerals in embodiments below, and redundant descriptions will be omitted or simplified.

FIGS. 17 to 26 are schematic cross-sectional views illustrating steps of a manufacturing method of a display device according to additional embodiments. FIGS. 17 to 26 are cross-sectional views for illustrating the manufacturing method of the display device of FIG. 6, and constituent elements substantially the same as those of FIG. 6 are denoted by the same reference numerals and detailed reference numerals are omitted in FIGS. 17 to 26.

Figure 17:
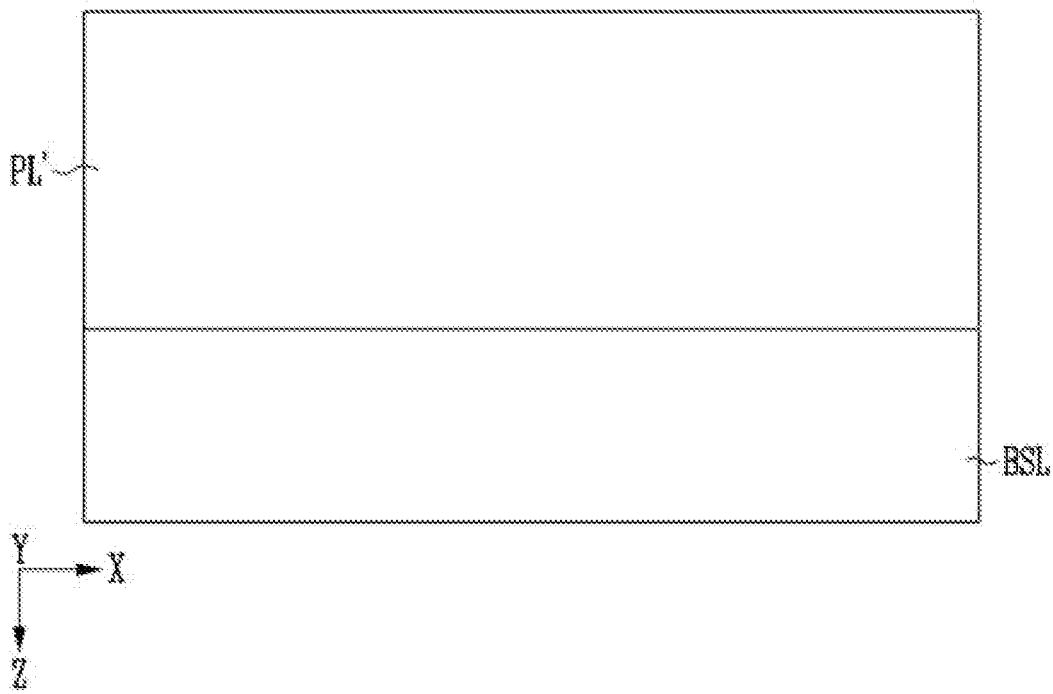
FIGS. 17 to 26 are schematic cross-sectional views illustrating steps of a manufacturing method of a display device according to another embodiment.

Referring to FIG. 17, first, a base layer BSL may be prepared, and a semiconductor layer PL' may be formed on the base layer BSL. Since the base layer BSL and the semiconductor layer PL' have been described in detail with reference to FIG. 7, duplicate descriptions will be omitted.

Figure 18:
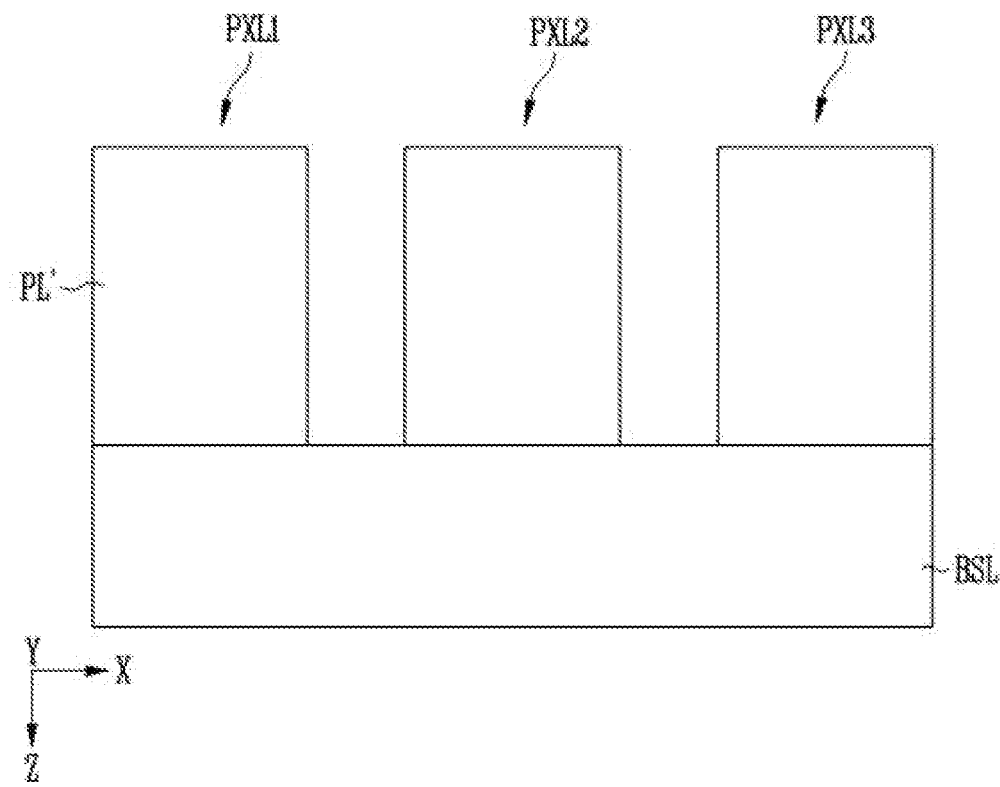

Referring to FIG. 18, the semiconductor layer PL' may then be patterned to form a semiconductor layer PL' in each of the first to third pixels PXL1, PXL2, and PXL3. Each of the semiconductor layer PL' of the first to third pixels PXL1, PXL2, and PXL3 may be formed at a position where light-emitting elements LD, which will be described later, may be provided.

Figure 19:
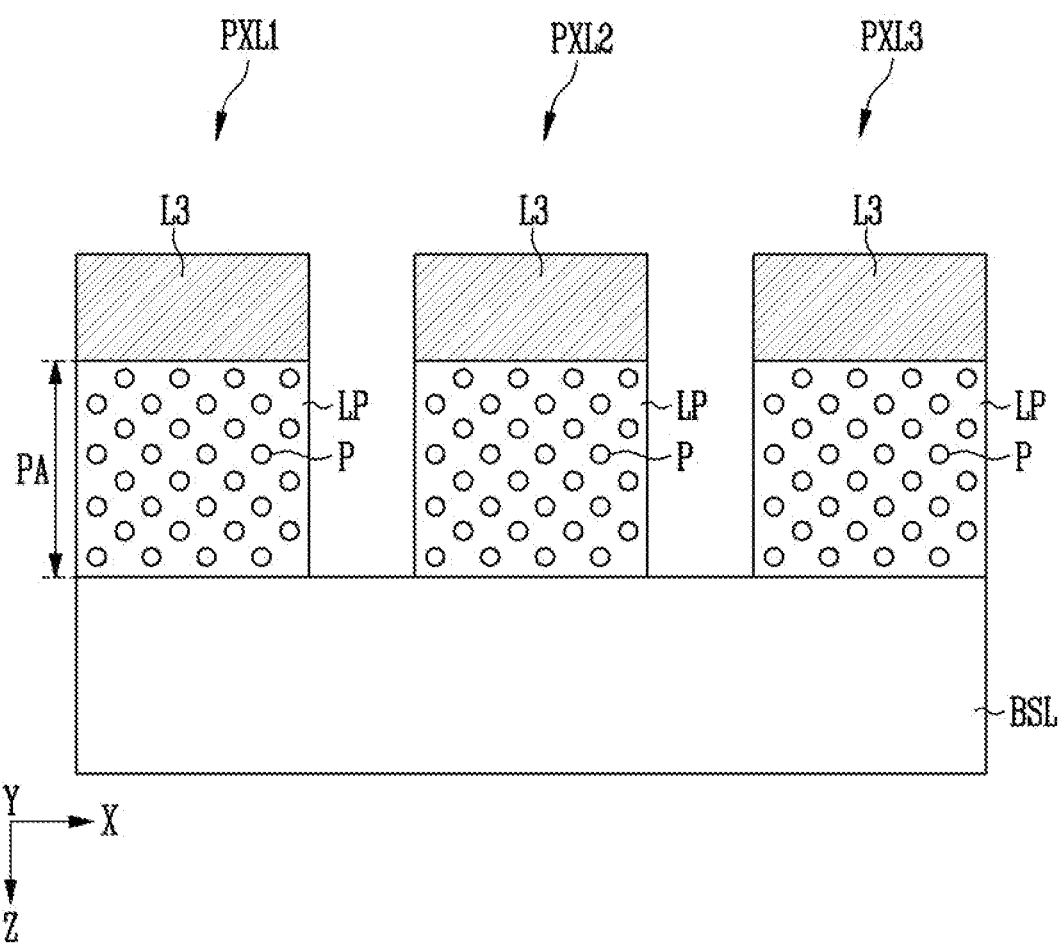

Referring to FIG. 19, a porous layer LP may then be formed by at least partially etching the semiconductor layer PL' of each of the first to third pixels PXL1, PXL2, and PXL3. For example, the semiconductor layer PL' may be electrochemically etched to form nanoscale pores P of the porous layer LP. During the electrochemical etching of the semiconductor layer PL', the size, shape, and distribution of the pores P may be variously adjusted according to an etchant, a voltage, and/or a doping concentration. The porous layer LP of each of the first to third pixels PXL1, PXL2, and PXL3 may constitute a porous area PA of each of the first to third light-emitting elements LD1, LD2, and LD3 to be described later. The unetched area of the semiconductor layer PL' may be the second semiconductor layer L3, and may constitute a light-emitting area EA of each of the first to third light-emitting elements LD1, LD2, and LD3 together with the first semiconductor layer L1 and the active layer L2 formed in a subsequent process.

Figure 20:
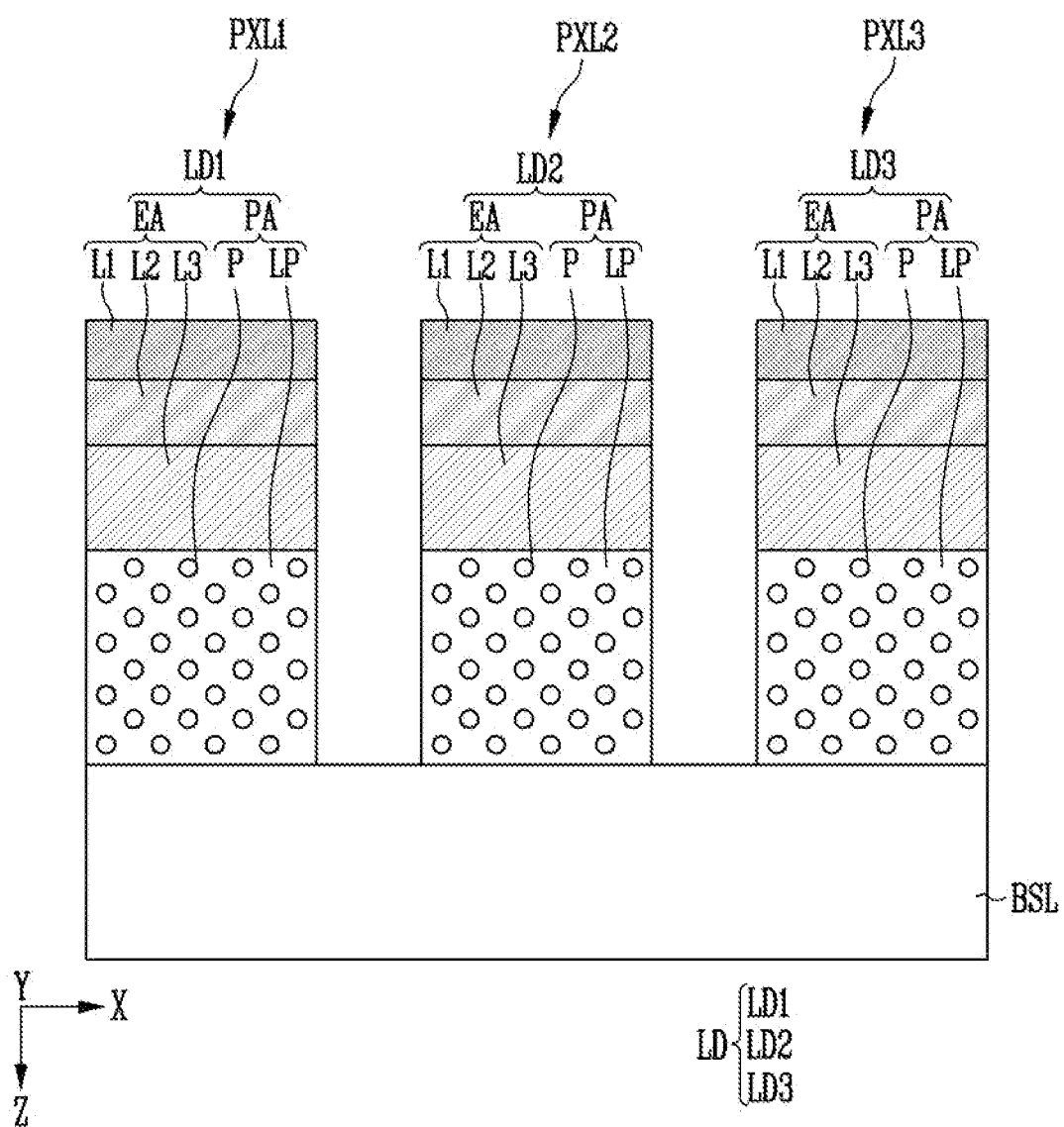

Referring to FIG. 20, a first semiconductor layer L1 and an active layer L2 may be formed on the porous layer LP and the second semiconductor layer L3 of each of the first to third pixels PXL1, PXL2, and PXL3. The first semiconductor layer L1 and/or the active layer L2 of each of the first to third pixels PXL1, PXL2, and PXL3 may be formed by growing a seed crystal by an epitaxial method.

The first semiconductor layer L1, the active layer L2, and the second semiconductor layer L3 provided on the porous layer LP of each of the first to third pixels PXL1, PXL2, and PXL3 may be light-emitting stacks, and may constitute the light-emitting area EA of each of the first to third pixels PXL1, PXL2, and PXL3. As described above, the light-emitting area EA of each of the first to third light-emitting elements LD1, LD2, and LD3 may be formed to emit light of different colors. For example, the light-emitting area EA of the first light-emitting element LD1 may emit a first color (or red), the light-emitting area EA of the second light-emitting element LD2 may emit a second color (or green), and the light-emitting area EA of the third light-emitting element LD3 may emit a third color (or blue). As described above, since each of the first to third light-emitting elements LD1, LD2, and LD3 includes the light-emitting area EA emitting light of different colors, a full color image can be displayed. Therefore, since the color conversion layer and/or the color filter layer separately provided in each of the first to third pixels PXL1, PXL2, and PXL3 may be omitted, it may be possible to simplify the manufacturing process and reduce the cost as described above.

Figure 21:
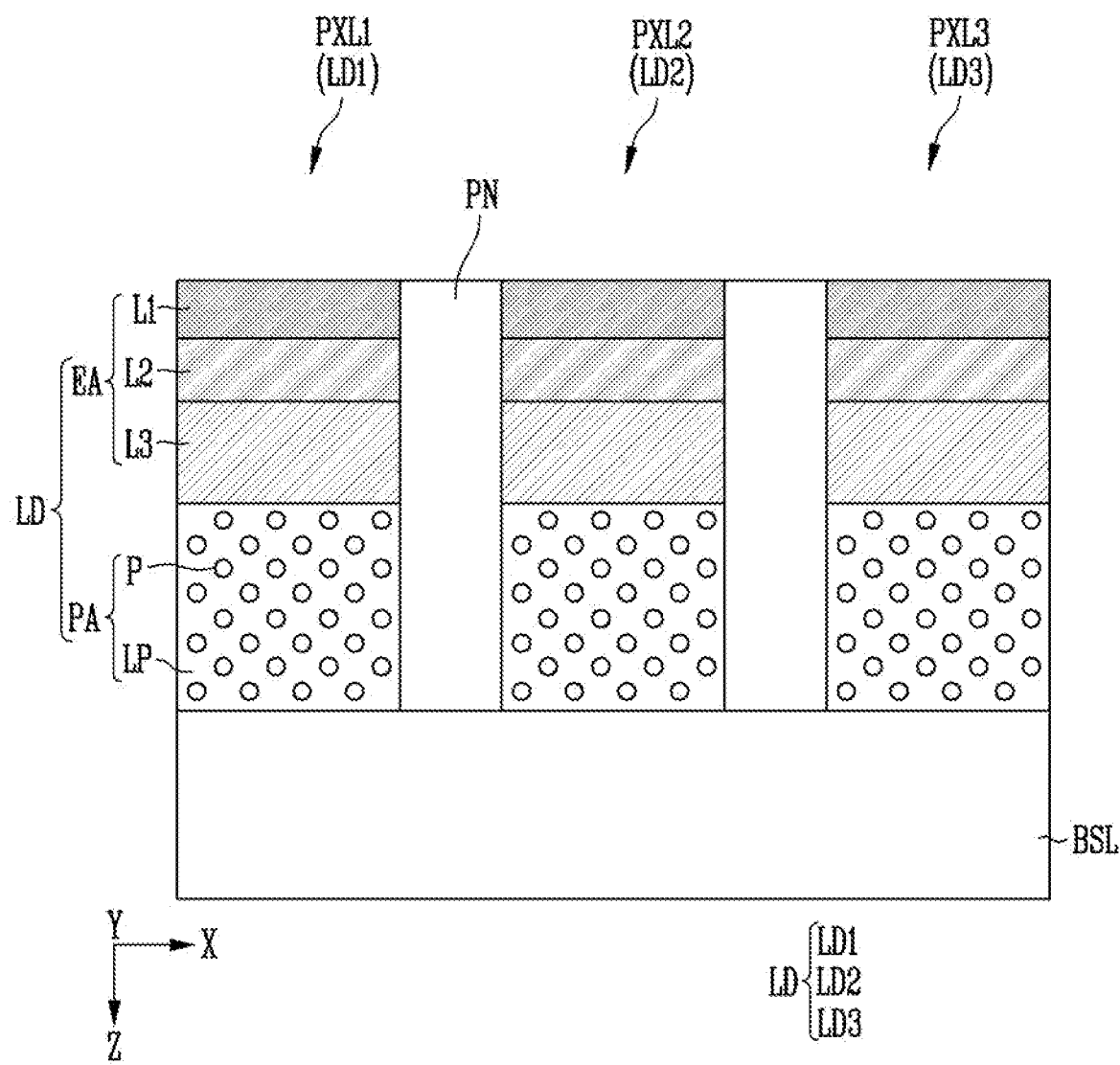

Referring to FIG. 21, a planarization layer PN may then be formed between the first to third light-emitting elements LD1, LD2, and LD3. The planarization layer PN may be formed at a boundary between the first to third pixels PXL1, PXL2, and PXL3. The planarization layer PN may be formed between the light-emitting elements LD and serve to planarize a step difference between the light-emitting elements LD. The planarization layer PN may be formed on side surfaces of the light-emitting elements LD. For example, the planarization layer PN may cover side surfaces of the light-emitting elements LD, but expose upper surfaces of the light-emitting elements LD.

In an embodiment, the planarization layer PN may be formed of an organic material such as an acrylic resin, epoxy resin, phenolic resin, polyamides resin, polyimides resin, polyesters resin, polyphenylenesulfides resin, benzocyclobutene (BCB), or a combination thereof, but is not necessarily limited thereto.

According to embodiments, the planarization layer PN may be formed of an inorganic material such as silicon oxide (SiOx), silicon nitride (SiNx), silicon oxynitride (SiOxNy), silicon oxycarbide (SiOxCy), aluminum oxide (AlOx), aluminum nitride (AlNx), zirconium oxide (ZrOx), hafnium oxide (HfOx), titanium oxide (TiOx), or a combination thereof.

Figure 22:
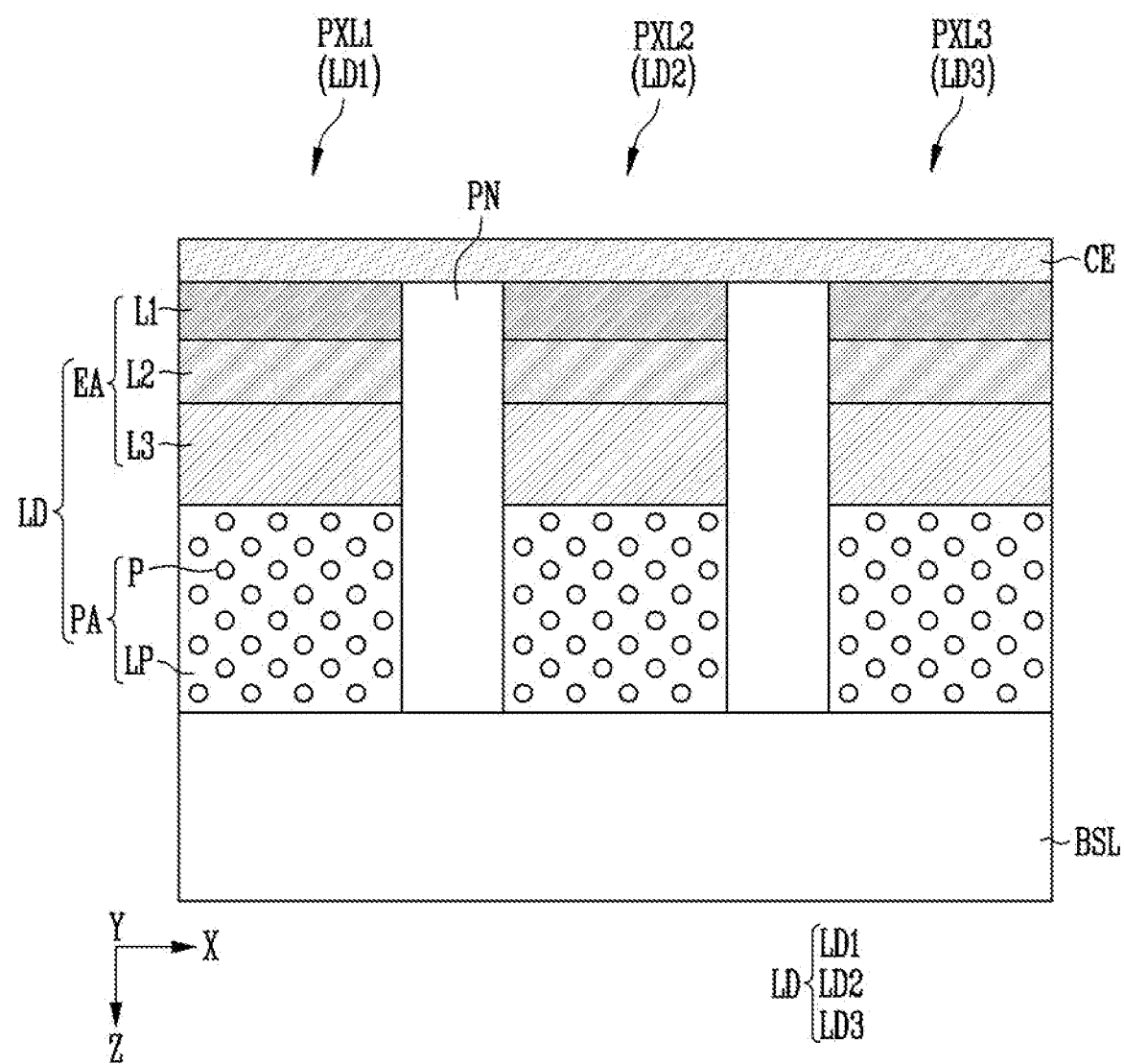

Referring to FIG. 22, a connection electrode CE may then be formed on the first to third light-emitting elements LD1, LD2, and LD3 and the planarization layer PN. The connection electrode CE may be formed over the first to third pixels PXL1, PXL2, and PXL3. The connection electrode CE may be formed of a metal or a metal oxide. For example, the connection electrode CE may be formed of copper (Cu), gold (Au), chromium (Cr), titanium (Ti), aluminum (Al), nickel (Ni), indium tin oxide (ITO), oxides of alloys thereof, and the like, but is not necessarily limited thereto.

Figure 23:
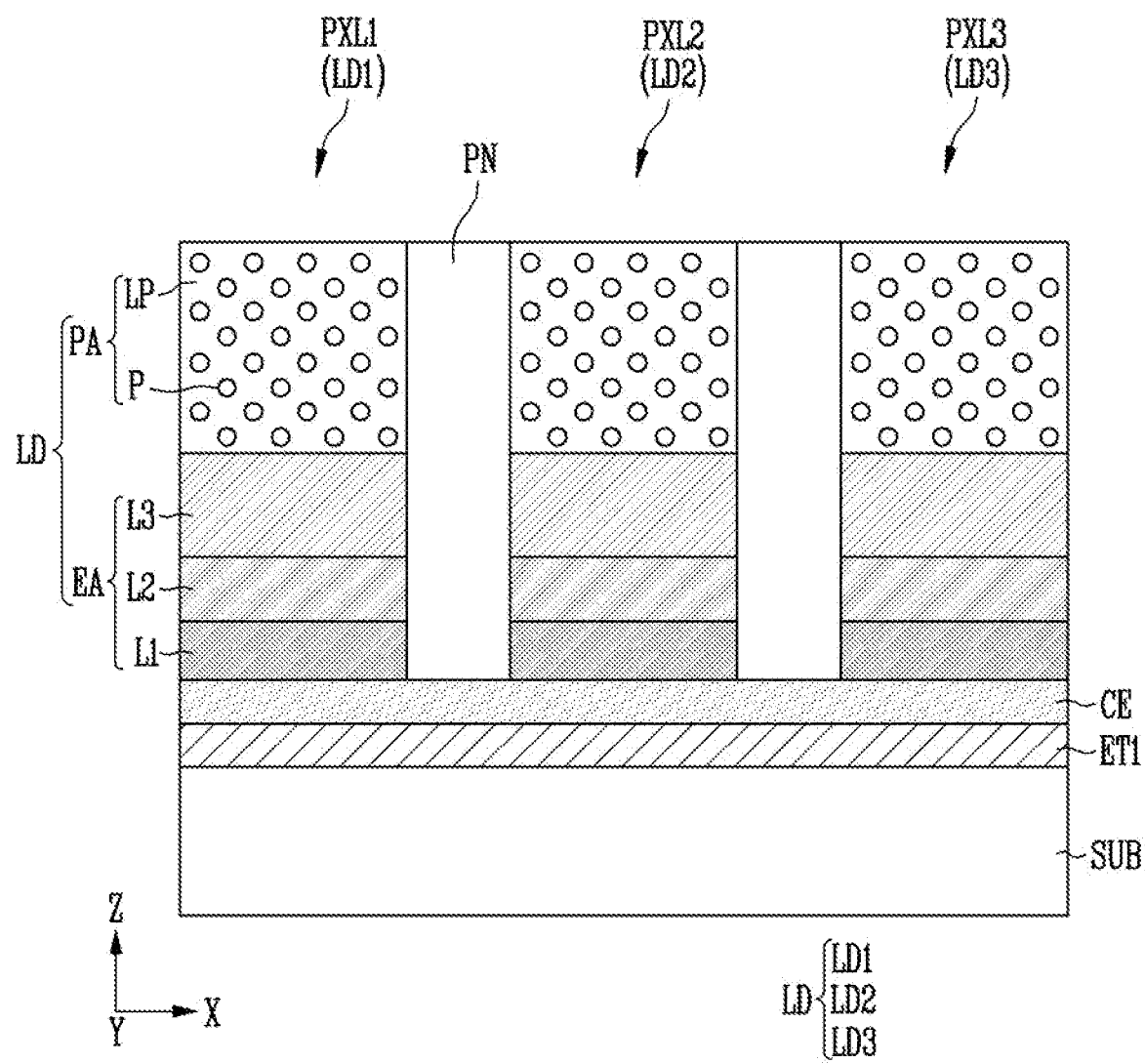

Referring to FIG. 23, the first to third light-emitting elements LD1, LD2, and LD3 may be combined to the substrate SUB. The substrate SUB may be a driving substrate including circuit elements including transistors constituting the pixel circuit PXC (see FIG. 2) of each pixel PXL, and a first electrode ET1 may be provided therein.

The first semiconductor layer L1 of each of the first to third light-emitting elements LD1, LD2, and LD3 may be combined to the first electrode ET1 formed on the substrate SUB. The first semiconductor layer L1 may be easily bonded to the first electrode ET1 provided on the substrate SUB through the connection electrode CE. After bonding the first to third light-emitting elements LD1, LD2, and LD3 to the substrate SUB, the base layer BSL may be separated from a surface of the porous layer LP.

Figure 24:
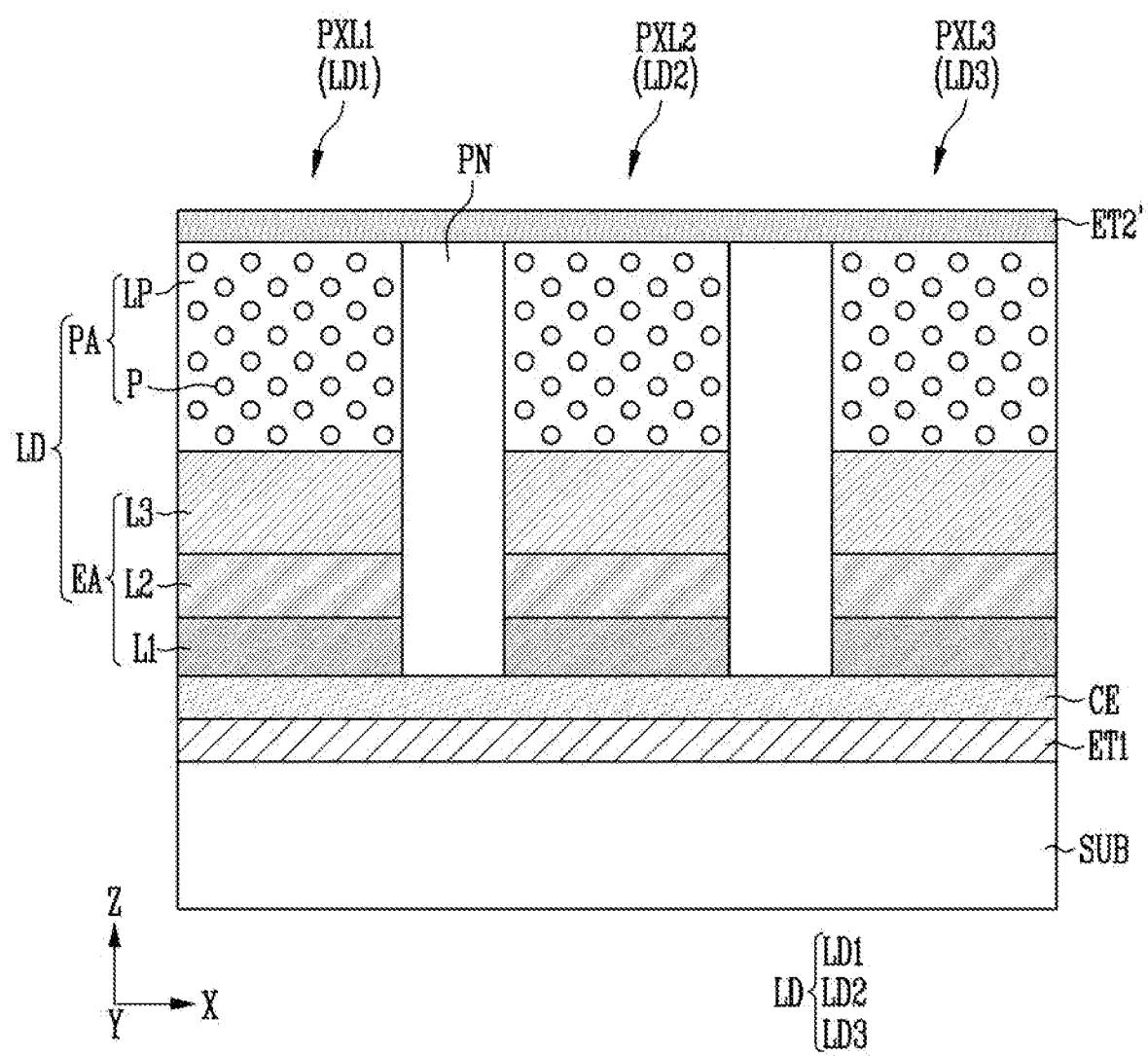

Referring to FIG. 24, a second electrode layer ET2' may then be formed on the first to third light-emitting elements LD1, LD2, and LD3. The second electrode layer ET2' may be directly formed on upper surfaces of the light-emitting elements LD exposed by the planarization layer PN to be in contact with the porous area PA of the light-emitting elements LD, that is, the porous layer LP. The second electrode layer ET2' may be formed over the first to third pixels PXL1, PXL2, and PXL3.

The second electrode layer ET2' may be formed of various transparent conductive materials. For example, the second electrode layer ET2' may be formed of at least one of various transparent conductive materials including indium tin oxide (ITO), indium zinc oxide (IZO), indium tin zinc oxide (ITZO), aluminum zinc oxide (AZO), gallium zinc oxide (GZO), zinc tin oxide (ZTO), gallium tin oxide (GTO), or a combination thereof, and may be substantially transparent or translucent to satisfy a light transmittance.

Figure 25:
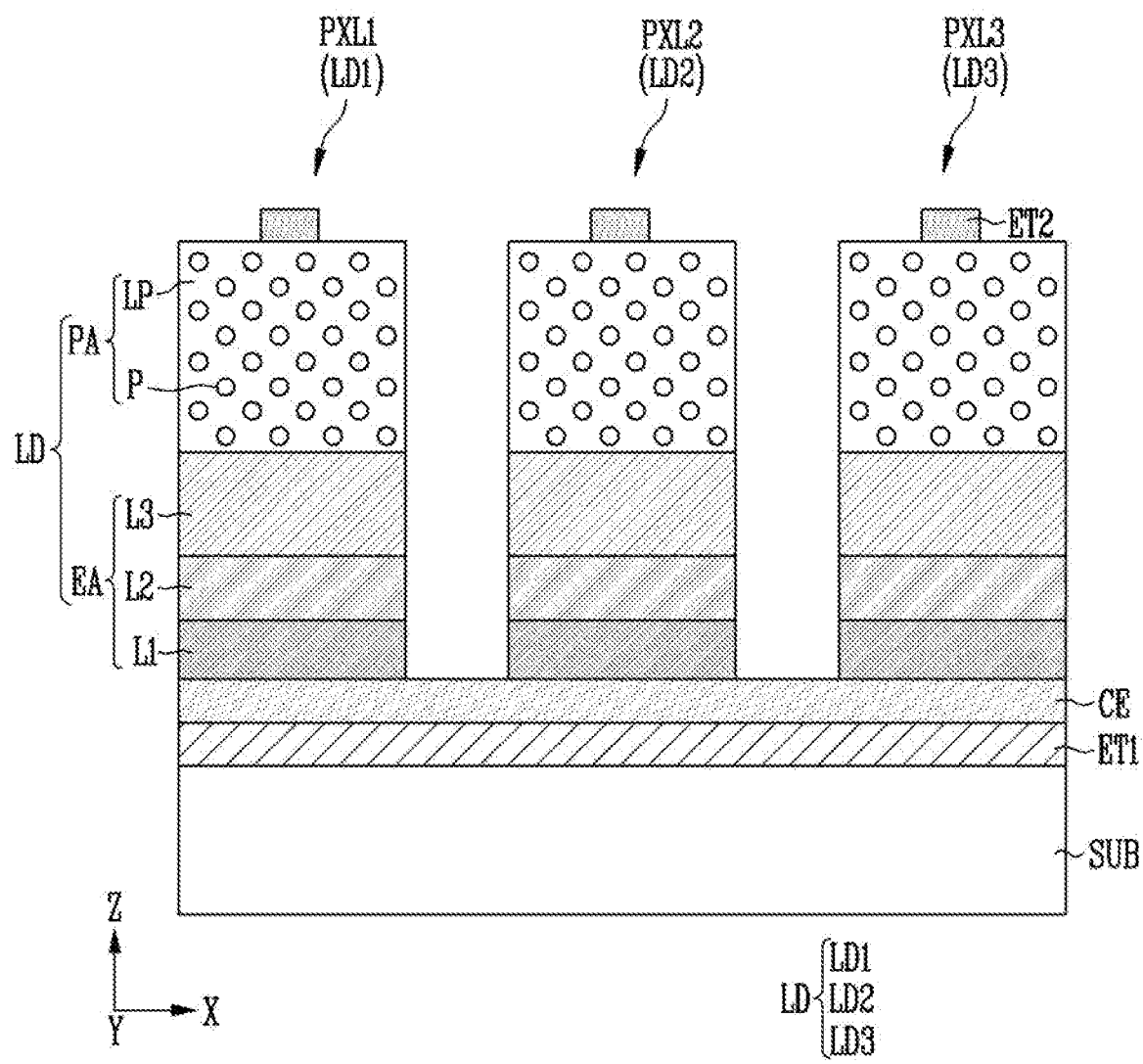

Referring to FIG. 25, the second electrode layer ET2' may then be patterned to form a second electrode ET2 on each of the first to third light-emitting elements LD1, LD2 and LD3, and a planarization layer PN may be removed.

Figure 26:
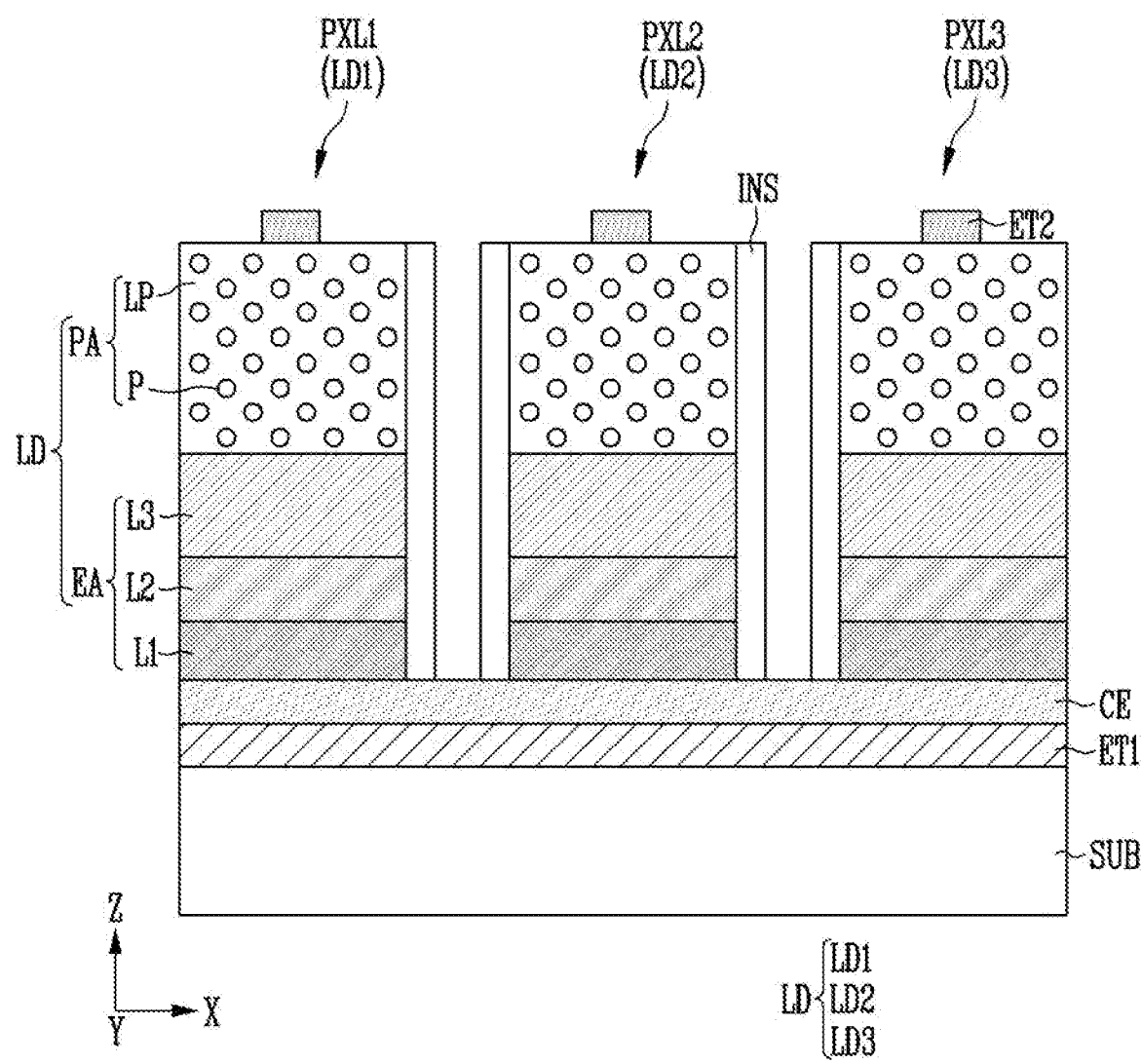

Referring to FIG. 26, an insulating layer INS may be formed on the first to third light-emitting elements LD1, LD2, and LD3. The insulating layer INS may be partially formed on side surfaces of the light-emitting elements LD and/or the bank patterns BNP. After the insulating layer INS may be formed over the first to third pixels PXL1, PXL2, and PXL3, it may be partially removed so that upper surfaces of the light-emitting elements LD may be exposed. In an embodiment, in case that the light-emitting elements LD are formed in the third direction (i.e., Z-axis direction), that is, perpendicular to the substrate SUB, the insulating layer INS provided on upper surface of the light-emitting elements LD may be etched without a separate mask.

Subsequently, the display device of FIG. 6 may be completed by forming a reflective layer RF between the first to third light-emitting elements LD1, LD2, and LD3. The reflective layer RF may reflect light emitted from the light-emitting elements LD to improve light-output efficiency of the display panel PNL. Also, the reflective layer RF may be disposed at the boundary between the first to third pixels PXL1, PXL2, and PXL3 to prevent color mixing between adjacent pixels PXL. The material of the reflective layer RF is not particularly limited and may be formed of various reflective materials.

According to the above-described embodiments, since each of the first to third light-emitting elements LD1, LD2, and LD3 may include the light-emitting area EA emitting light of different colors, the color conversion layer and/or the color filter layer may be omitted, and thus the manufacturing process may be simplified and cost may be reduced. As described above, the porous area PA may be embedded in the light-emitting elements LD to improve light-output efficiency of the display panel PNL and to simplify the manufacturing process simultaneously.

Hereinafter, an electronic device to which the display devices of the above-described embodiments can be applied will be described.

FIGS. 27 to 30 are views illustrating electronic devices according to various embodiments.

Figure 27:
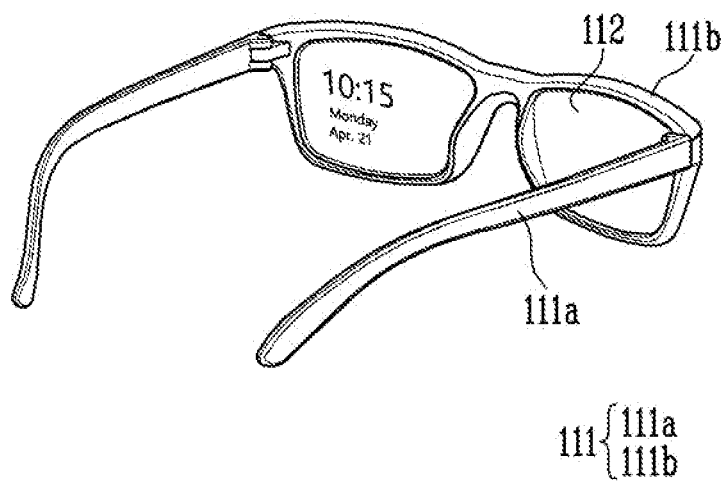
FIGS. 27 to 30 are schematic views illustrating electronic devices according to various embodiments.

Referring to FIG. 27, the display device according to the above-described embodiments may be applied to smart glasses. The smart glass may include a frame 111 and a lens unit 112. The smart glasses are wearable electronic devices that can be worn on a user's face, and may have a structure in which a part of the frame 111 may be folded or unfolded. For example, the smart glasses may be a wearable device for augmented reality (AR).

The frame 111 may include a housing 111*b* supporting the lens unit 112 and a leg unit 111*a* for wearing by the user. The leg unit 111*a* may be folded or unfolded by being connected to the housing 111*b* by a hinge.

A battery, a touch pad, a microphone, and/or a camera may be embedded in the frame 111. A projector for outputting light and/or a processor for controlling an optical signal may be embedded in the frame 111.

The lens unit 112 may be an optical member that transmits light or reflects light. The lens unit 112 may include glass and/or a transparent synthetic resin.

The display device according to the above-described embodiments may be applied to the lens unit 112. For example, the user may recognize an image displayed by an optical signal transmitted from the projector of the frame 111 through the lens unit 112. For example, the user may recognize information such as time and date displayed on the lens unit 112.

Figure 28:
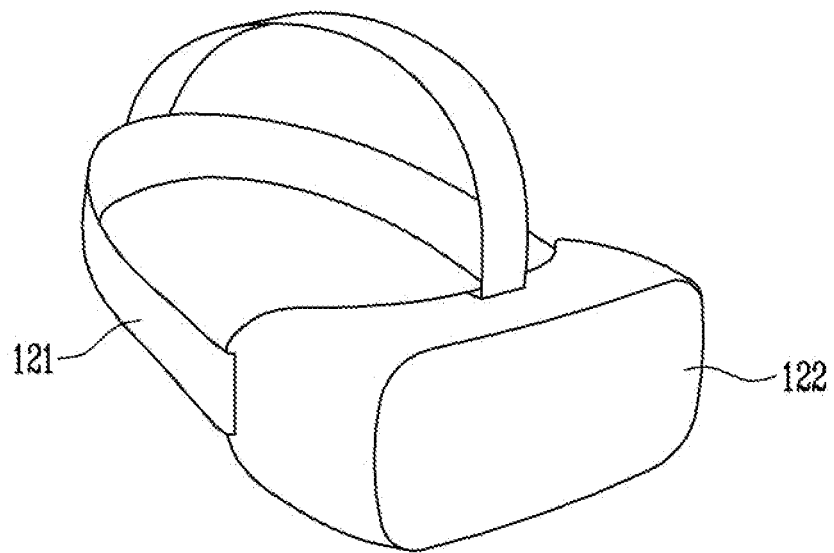

Referring to FIG. 28, the display device according to the above-described embodiments may be applied to a head mounted display (HMD). The head mounted display may include a head mounted band 121 and a display storage case 122. For example, the head mounted display may be a wearable electronic device that can be worn on a user's head.

The head mounting band 121 may be connected to the display storage case 122 to fix the display storage case 122. The head mounted band 121 may include a horizontal band and a vertical band for fixing the head mounted display to the user's head, as shown in FIG. 28, the horizontal band may be provided to surround a side portion of the user's head, and the vertical band may be provided to surround an upper portion of the user's head. However, the disclosure is not necessarily limited thereto, and the head mounting band 121 may be implemented in a form of an eyeglass frame or a helmet.

The display storage case 122 may accommodate the display device and may include at least one lens. At least one lens may provide an image to the user. For example, the display device according to the above-described embodiments may be applied to a left eye lens and a right eye lens implemented in the display storage case 122.

Figure 29:
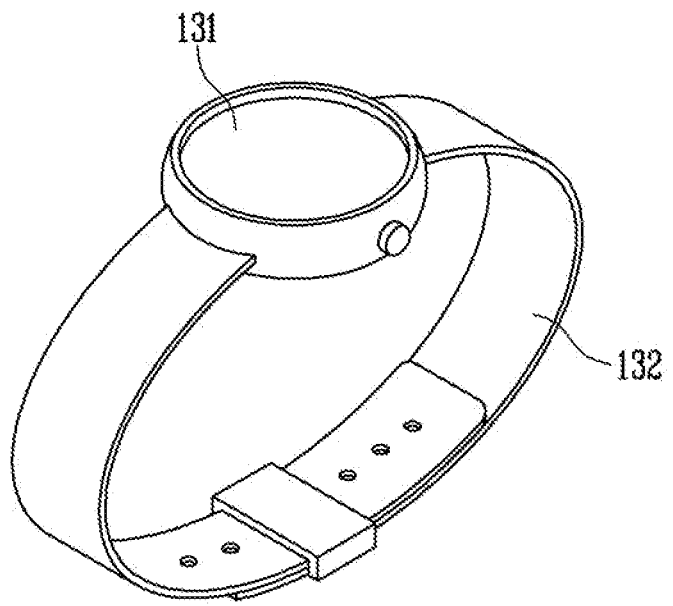

Referring to FIG. 29, the display device according to the above-described embodiments may be applied to a smart watch. The smart watch may include a display unit 131 and a strap unit 132. The smart watch may be a wearable electronic device, and the strap unit 132 thereof may be mounted on the user's wrist. The display device according to the above-described embodiments may be applied to the display unit 131. For example, the display unit 131 may provide image data including information such as time and date.

Figure 30:
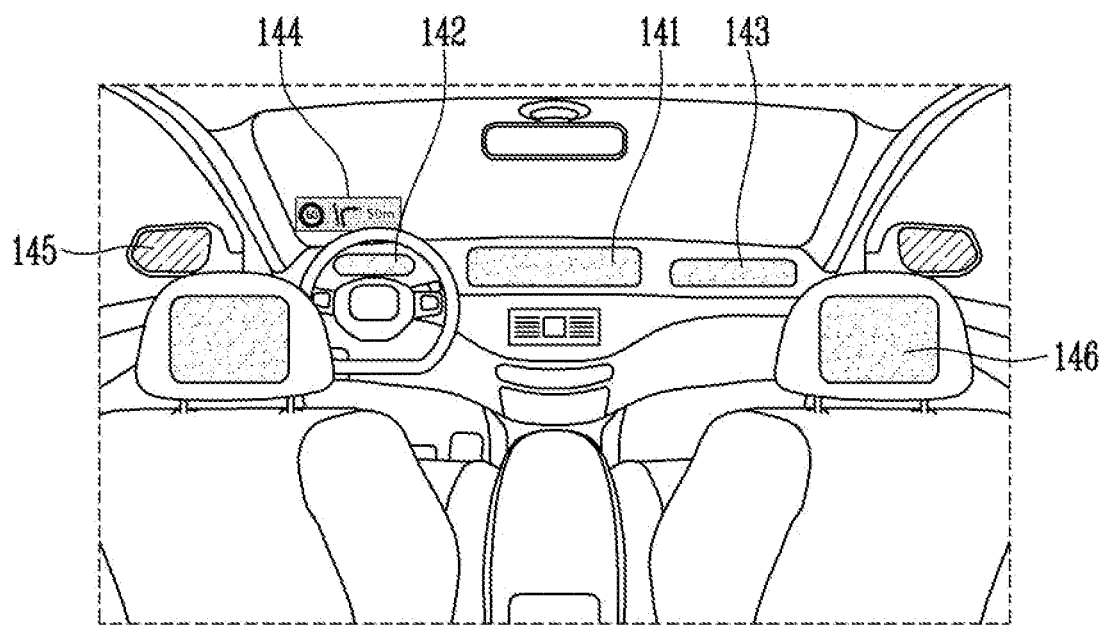

Referring to FIG. 30, the display device according to the above-described embodiments may be applied to an automotive display. For example, the automotive display may refer to an electronic device provided inside and outside a vehicle to provide image data.

For example, the display device according to the above-described embodiments may be applied to at least one of an infotainment panel 141, a cluster 142, a co-driver display 143, a head-up display 144, a side mirror display 145, and a rear-seat display 146.

A person of ordinary skill in the art related to this disclosure will understand that it can be implemented in a modified form within a range that does not deviate from the basic characteristics of the description. Therefore, the disclosed embodiments are to be considered in an illustrative sense rather than a restrictive sense. The scope of the disclosure is indicated in the claims rather than the foregoing description, and all differences within an equivalent scope should be construed as being included in the disclosure.

What is claimed is:

1. A display device configured to display variable images, the display device comprising:
   bank patterns disposed on a substrate; and
   light-emitting elements disposed on the substrate,
   wherein each of the light-emitting elements includes:
      a light-emitting area including:
         a first semiconductor layer;
         an active layer disposed on the first semiconductor layer;

a second semiconductor layer disposed on the active layer; and
a porous layer disposed on the second semiconductor layer; and
a color conversion layer disposed on the light-emitting elements, wherein
the porous layer is disposed between the color conversion layer and the light-emitting area of each of the light emitting elements in a thickness direction of the display device, and
each of the light-emitting elements, the porous layer, and the color conversion layer are disposed between neighboring ones of the bank patterns in a lateral direction perpendicular to the thickness direction of the display device.

2. The display device of claim 1, wherein the porous layer includes nanoscale pores.

3. The display device of claim 1, wherein the porous layer and the second semiconductor layer include a same material.

4. The display device of claim 1,
wherein
the bank patterns also include a porous layer that is formed from a same layer as the porous layer of the light emitting elements.

5. The display device of claim 4, further comprising:
a reflective layer disposed between the light-emitting elements.

6. The display device of claim 5, further comprising:
an insulating layer disposed between the light-emitting elements and the reflective layer.

7. The display device of claim 4, wherein the porous layer of the bank patterns includes a plurality of pores that are comprised of an empty space.

8. The display device of claim 1, wherein
the light-emitting elements are disposed in:
a first pixel emitting light of a first color;
a second pixel emitting light of a second color; and
a third pixel emitting light of a third color, and
the first color, the second color and the third color correspond to red, green, and blue respectively.

9. The display device of claim 1, further comprising:
a color filter layer disposed on the color conversion layer, the color filer layer including a first color filter that corresponds to a first pixel, a second color filter that corresponds to a second pixel, and a third color filter that corresponds to a third pixel, and
the first color filter selectively transmits light of a first color, the second color filter selectively transmits light of a second and different color, and the third color filter selectively transmits light of a third and different color.

10. A display device configured to display variable images, the display device comprising:
bank patterns disposed on a substrate; and
light-emitting elements disposed on the substrate, wherein
each of the light-emitting elements includes:
a light-emitting area including:
a first semiconductor laver:
an active layer disposed on the first semiconductor laver,
a second semiconductor layer disposed on the active laver; and
a porous layer disposed on the second semiconductor laver; and
a color conversion layer disposed on the light-emitting elements,
the porous layer is disposed between the color conversion layer and the light-emitting area of each of the light emitting elements in a thickness direction of the display device,
the bank patterns and the light-emitting elements include a same material and are formed from a same laver,
the porous layer includes a plurality of pores, and
each of the pores is absent of a solid material.

11. The display device of claim 10, wherein each of the light-emitting elements, the porous layer, and the color conversion layer are disposed between neighboring ones of the bank patterns in a cross-sectional view.

12. The display device of claim 10, wherein a combined height of the light emitting elements, the porous layer and the color conversion layer is substantially equal to a height of the bank patterns.

* * * * *